United States Patent [19]

Lefevre et al.

[11] Patent Number: 4,733,938
[45] Date of Patent: Mar. 29, 1988

[54] MAGNETO-OPTIC ROTATOR

[75] Inventors: Herve C. Lefevre; Ralph A. Bergh, both of Palo Alto, Calif.

[73] Assignee: The Board of Trustees of the Leland Stanford Junior University, Stanford, Calif.

[21] Appl. No.: 829,421

[22] Filed: Feb. 13, 1986

Related U.S. Application Data

[63] Continuation of Ser. No. 319,421, Nov. 9, 1981, Pat. No. 4,615,582.

[51] Int. Cl.⁴ ................................................. G02B 6/16
[52] U.S. Cl. ............................. 350/96.29; 350/96.15; 350/96.30; 350/375; 350/376; 324/244; 356/351
[58] Field of Search ............... 350/96.15, 96.16, 96.29, 350/96.30, 375, 376, 378; 356/350, 351, 365, 368; 324/244

[56] References Cited

U.S. PATENT DOCUMENTS

| 3,756,689 | 9/1973 | Hammond et al. | 350/149 |
| 3,756,690 | 9/1973 | Borrelli et al. | 350/151 |
| 4,255,018 | 3/1981 | Ulrich et al. | 350/375 |
| 4,298,245 | 11/1981 | Aulich et al. | 350/96.29 |
| 4,299,490 | 11/1981 | Cahill et al. | 356/350 |
| 4,372,685 | 2/1983 | Ulrich | 356/350 |
| 4,389,090 | 6/1983 | LeFevre | 350/96.29 |
| 4,410,275 | 10/1983 | Shaw et al. | 356/350 |
| 4,450,406 | 5/1984 | Bobb | 350/96.29 X |

FOREIGN PATENT DOCUMENTS

| 44572 | 1/1982 | European Pat. Off. |
| 2855337 | 7/1980 | Fed. Rep. of Germany |

OTHER PUBLICATIONS

A. Papp and H. Harms, "Polarization Optics of Liquid-Core Optical Fibers", Applied Optics, vol. 16, No. 5 (May 1977), pp. 1315-1319.
S. C. Rashleigh, et al., "Magneto-Optic Current Sensing With Birefringent Fibers", Applied Physics Letters, vol. 34, No. 11, Jun. 1979, pp. 768-770.
H. C. Lefevre, "Single-Mode Fibre Fractional Wave Devices and Polarisation Controllers", Electronics Letters, vol. 16, No. 20, Sep. 1980, pp. 778-780.

Primary Examiner—John Lee
Assistant Examiner—Frank González
Attorney, Agent, or Firm—Knobbe, Martens, Olson & Bear

[57] ABSTRACT

A single, continuous strand of fiber optic material is wrapped about a mandrel to form oval-shaped loops having parallel sides and curved ends. A magnet is positioned so that its B-field is substantially parallel to the straight portions of the loops. As light propagates through these straight portions of the loops, its direction of polarization is rotated in accordance with the Faraday effect. The curved portions are formed to create sufficient linear birefringence to provide a phase difference of 180 degrees between light in the two orthogonal polarization modes of the fiber. This advantageously causes the Faraday rotations in each of the straight portions to add, rather than cancel. The magneto-optic rotator of the present invention is useful in a variety of applications such as an optical isolator, a modulator, and a magnetometer.

2 Claims, 29 Drawing Figures

MAGNETO-OPTIC ROTATOR

This application is a continuation of application Ser. No. 319,421, filed Nov. 9, 1981, now U.S. Pat. No. 4,615,582.

BACKGROUND OF THE INVENTION

The present invention relates to magneto-optic rotators, which rotate the direction of polarization of polarized light passed through them, and particularly to magneto-fiber optic rotators utilizing the Faraday effect.

Some substances are themselves optically active in a manner which rotates the polarization of light passed therethrough. However, glass (silica), the material most commonly used for optical fibers, does not exhibit this property. In 1845, Faraday discovered that glass and other substances, otherwise devoid of this property, acquire it when placed in a strong magnetic field. Light traversing the substance, parallel to the lines of magnetic force, is affected thereby, so that the direction of polarization of the light is rotated. This is commonly referred to as the "Faraday effect". A particularly interesting feature of the Faraday effect is that the direction of rotation for a given lightwave is the same from the viewpoint of a fixed observer, regardless of the direction of propagation. Thus, a light beam passing through the field, once in each direction, would have its rotation doubled (which is not the case with natural optical activity).

The amount of such Faraday rotation is dependent upon the following factors:
1. The Verdet constant of the material (an indication of the susceptibility of the material to the Faraday effect);
2. The intensity of the portion of the magnetic field applied to the material that is parallel to the direction of propagation of the light; and
3. The length over which the magnetic field is applied to the material.

Silica has a relatively low Verdet constant. Thus, in order to generate an appreciable Faraday rotation in a silica optical fiber, the magnetic field intensity must be extremely strong, or the length of fiber immersed in the field must be extremely long, or both. As an indication of the difficulties involved in achieving significant Faraday rotation in glass optical fibers, it will be understood that a single mode fiber approximately 12 centimeters in length will require a magnetic field strength (in a direction parallel to the fiber) of approximately 1,000 gauss to produce a Faraday rotation of only about 1½ degrees. Thus, because of the low Verdet constant of silica, it is very difficult to produce substantial Faraday rotation in glass optical fibers.

SUMMARY OF THE INVENTION

The present invention comprises a single, continuous uninterrupted strand of single mode fiber optic material which is wrapped about a mandrel to form oval-shaped loops having parallel sides and curved ends. A magnet is positioned so that its B field vector (i.e., magnetic flux density) is substantially parallel to the straight portions of the loops. As light propagates through these straight portions (sides) of the loops, its direction of polarization is rotated in accordance with the Faraday effect.

The light propagating through the fiber reverses its direction of propagation as it travels from one side (straight portion) of a given loop to the other side of this loop. Thus, it will propagate in the same direction as the B field on one side of the loop, and will propagate in the opposite direction from the B field on the other side of the loop. Under these circumstances, one would ordinarily except that, from the viewpoint of a stationary observer, the direction of polarization on one side of the loop would be the mirror image of that on the other side of the loop, and thus, the rotations would cancel, yielding a net rotation of zero. However, in the present invention, the curved portions at the ends of the loops are formed to create a linear birefringence sufficient to provide a spatial separation between light in the polarization modes of one-half wavelength, or a phase difference of 180 degrees. This advantageously causes the direction of polarization to be rotated, so that in each of the straight portions of the loop, the polarization will appear the same to an observer, thereby permitting the Faraday rotations to add to each other, rather than cancel each other. Thus, by providing a series of these loops, a large Faraday rotation may be obtained, even though the Faraday rotation for one of the loops is relatively small.

By wrapping the fiber into loops, so that a substantial length, e.g., 4 meters, is exposed to the magnetic field, a significant Faraday rotation may be obtained utilizing a magnet which has only a moderate field strength. Further, the fiber loops permit the magneto-optic rotator of the present invention to be quite compact. This is advantageous, since it permits use of a magnet that is relatively small in size.

The magnetic flux density required for a given amount of Faraday rotation depends upon the number of fiber loops. In one embodiment, a magnetic flux density (B field) of 1,000 gauss applied to 16½ fiber loops having a length of about 15 cm each provides a Faraday rotation of about 45 degrees. Generation of such a magnetic field may be accomplished by any suitable means, e.g., an electro-magnet or a permanent magnet.

The magneto-optic rotator of the present invention is useful in a variety of applications, some of which involve additional optical components. For example, the rotator may be utilized as an optical isolator. In this application, the rotator would be used in combination with a polarizer. Light passing through the polarizer from the source would be rotated 45 degrees by the rotator, and, if it returns to the rotator with the same polarization as when it left, another 45 degrees upon its return. The two 45-degree rotations will add, so that the light returning to the source will be orthogonally polarized to that leaving it. The polarizer will reject this orthogonally polarized light to prevent such returning light from reaching the source.

In another application, the present invention may be used as a magnetometer by coupling counter-propagating lightwaves to it. Ambient magnetic fields (such as the earth's magnetic field) will affect the phase of each of the counter-propagating waves as they pass therethrough in the same manner as for the induced magnetic field, described above, and, by measuring the phase difference between these counter-propagating waves, the strength of the magnetic field may be determined.

In yet another application, the present invention may be used as an amplitude modulator by modulating the magnetic flux density of the magnetic field applied to the fiber loops, so that the direction of polarization is modulated. By passing this polarization modulated light through a polarizer, amplitude modulated light may be achieved. Similarly, the present invention may be used as a phase modulator by varying the strength of the magnetic field. Preferably, circularly polarized light is utilized so that the Faraday effect directly changes the phase of the light in response to the strength of the magnetic field.

BRIEF DESCRIPTION OF THE DRAWINGS

These and other advantages of the present invention may best be understood through reference to the drawings, in which.

DETAILED DESCRIPTION OF THE PREFERRED EMBODIMENT

Figure 14:
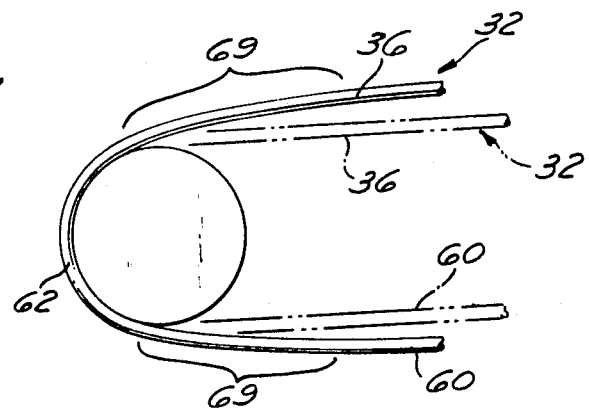
FIG. 14 is a schematic drawing illustrating the effect of wrapping the fiber of FIG. 12 with tension.
Figure 15:
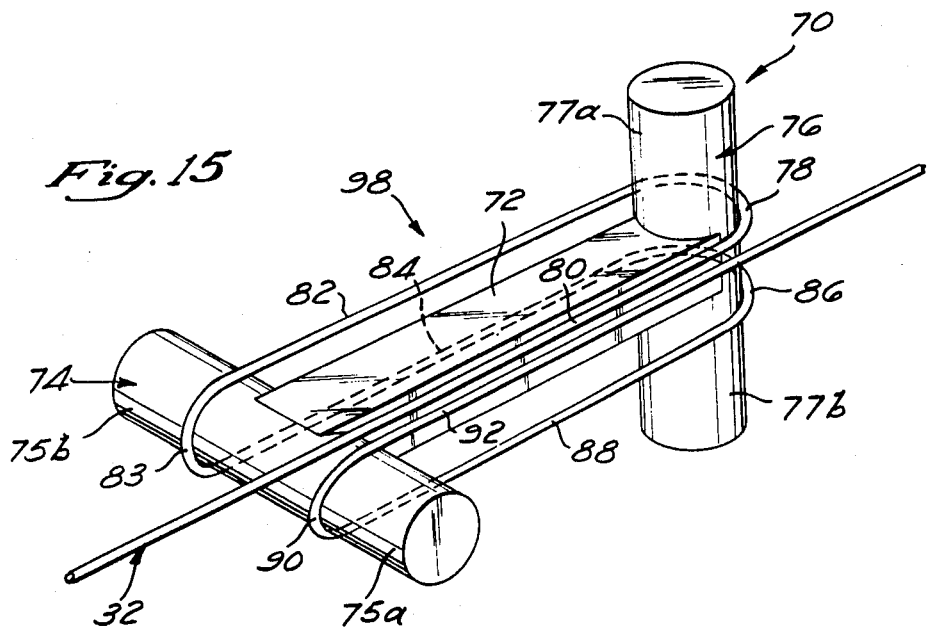
FIG. 15 is a perspective view of a fiber wrapped about a mandrel, in accordance with the teachings of FIGS. 11 and 12.
Figure 16:
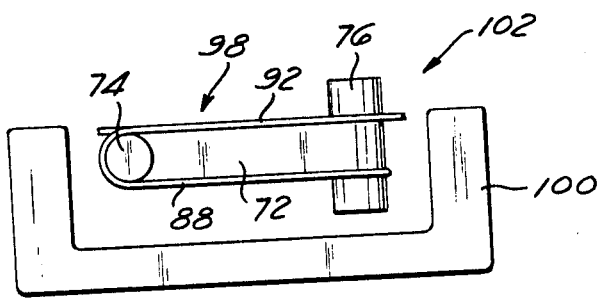
FIG. 16 is a schematic drawing showing the mandrel and fiber of FIG. 15 positioned between the poles of a magnet.

The magneto-optic rotator of the present invention is based upon concepts and principles which will be developed primarily through reference to FIGS. 1 through 14, while the structural aspects are shown principally in FIGS. 15 and 16. Specific applications of this magneto-optic rotator are illustrated in FIGS. 17 through 24.

A basic familiarity with polarization analysis is helpful to fully understanding the present invention. Accordingly, a brief description of two coordinate systems, utilized herein to describe the polarization of a given lightwave, will be set forth at the outset. Each of the coordinate systems relies upon the concept of normal modes, i.e., those modes which propagate through a fiber unchanged, except for the phase relation therebetween. The first coordinate system involves a set of normal modes for circular birefringence and the second coordinate system involves a set of normal modes for linear birefrigence. Thus, the first of these coordinate systems is particularly useful for analyzing the effects of circular birefringence (e.g., due to the Faraday effect), while the second coordinate system is more appropriate for analyzing the polarization effects of linear birefringence (e.g., due to bends in the fiber).

POLARIZATION ANALYSIS

Figure 1:
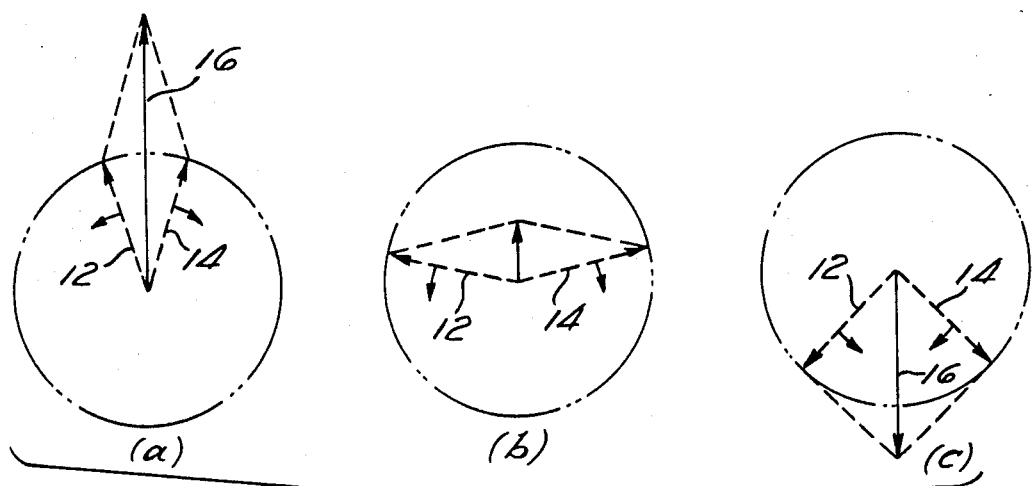
FIGS. 1A through 1C are schematic illustrations of a linearly polarized lightwave comprised of two counter-rotating electric field vectors, and showing the progression of the vectors as they counter-rotate through space.

In the first coordinate system, the polarization of a lightwave is expressed as the resultant of two circularly polarized components, each propagating in a respective one of two circular polarization modes of the fiber, having electric vectors which rotate in opposite directions, normally at the same velocity. One of the circular polarizations may be referred to as "right-hand circular", while the other may be referred to as "left-hand circular". The counter-rotating field vectors of the circularly polarized components of the light represent the normal modes (i.e., those modes which propagate unchanged except for phase) for circular birefringence, and are shown schematically in FIG. 1 as the vectors 12 and 14. The resultant of these vectors 12,14, representing the polarization of the lightwave, is represented by the vector 16. When the field vector magnitudes of the two circularly polarized components are equal, as in FIG. 1, the polarization of the lightwave represented thereby, is linear. This may be understood more fully by comparing FIGS. 1A, B, and C, which shows the progression of the vectors 12,14, as they counter-rotate through space. It will be seen that, since the magnitudes of the vectors 12,14 are equal, the resultant vector 16 will lie along a single line, which, in the case of FIG. 1, is a vertical line. Further, the resultant vector 16 will increase and decrease in magnitude along this vertical line, as may be seen by comparing FIGS. 1A through 1C. The orientation of the vertical line may be referred to as "the direction of polarization". In this regard, the linearly polarized light represented by the drawings of FIG. 1 has a direction of polarization that may be referred to as "vertical", since the orientation of the line along which the resultant vector 16 lies is vertical.

Figure 2:
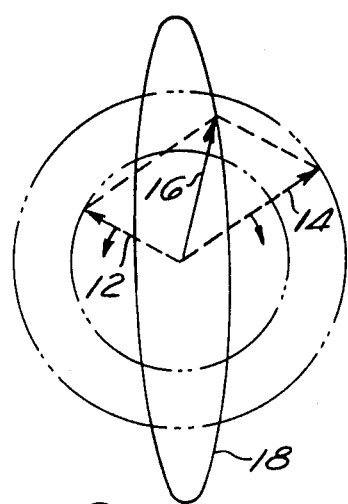
FIG. 2 is a schematic illustration of an elliptically polarized lightwave comprised of two counter-rotating electric field vectors which are unequal in magnitude.

When the magnitudes of the field vectors 12,14 are unequal, the polarization of the wave is said to be "elliptical", since, as shown in FIG. 2, the tip of the resultant vector 16 traces out an ellipse 18, as the field vectors 12,14 counter-rotate. Further, when the magnitude of one of the field vectors 12,14 is zero, the polarization of the wave is, of course, circular. This is exemplified in FIG. 3, which shows the resultant vector 16 in coincidence with one of the component field vectors, e.g., the vector 12, so that the tip of the vector 16 traces out a circle 19.

From the foregoing, it will be understood that polarized light may have varying degrees of ellipticity, which range from linear (ellipticity equals zero) at one extreme, to circular (ellipticity equals one) at the other extreme. This is in contrast to the term "direction of polarization", which refers to the orientation of the principal axis of the ellipse. Of course, circularly polarized light has no principal axis, and thus, light having this polarization will be referred to as either "right-hand circular" (clockwise direction) or "left-hand circular" (counter-clockwise direction). For circularly polarized light, a rotation in the direction of polarization manifests itself as a phase shift of the circularly polarized light.

Figure 3:
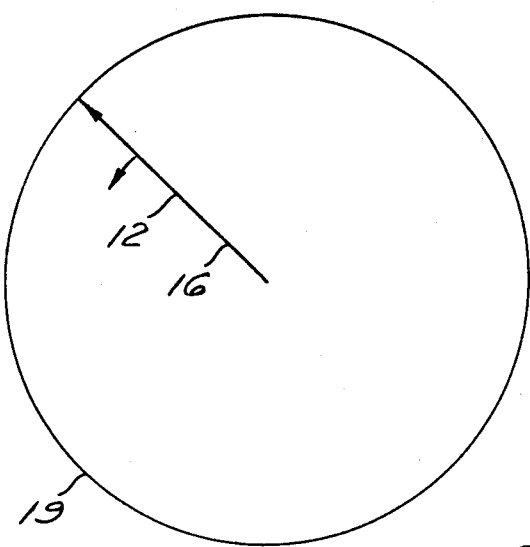
FIG. 3 is a schematic illustration of a circularly polarized lightwave comprised of a single rotating electric field vector.
Figure 4:
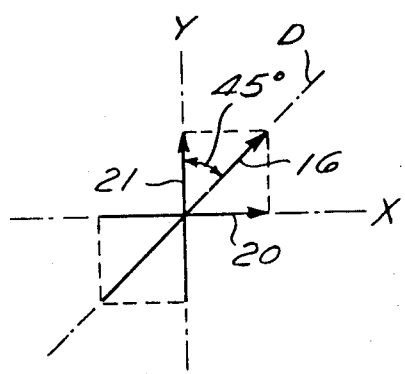
FIG. 4 is a schematic illustration of a linearly polarized lightwave comprised of two orthogonal electric field vectors which increase and decrease in magnitude, from positive to negative, along their respective axes, as the lightwave propagates.
Figure 5:
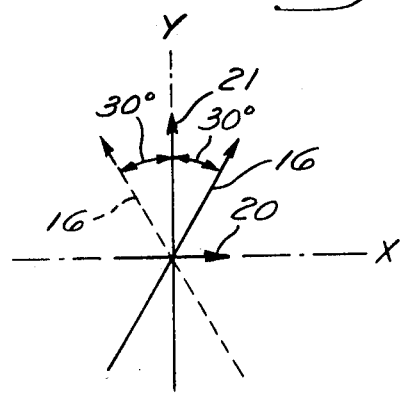
FIG. 5 is a schematic illustration of the linearly polarized lightwave of FIG. 4, showing the effect upon the direction of polarization of the lightwave, resulting from linear birefringence sufficient to provide a relative phase shift between light in the orthogonal polarization modes of 180 degrees (½ wavelength)

In the second coordinate system, appropriate for analyzing the effects of linear birefringence upon polarization, a simple cartesian coordinate system is utilized. The resultant vector 16, discussed in reference to FIGS. 1 through 3, is plotted in an XY plane, as shown in FIG. 4, and is resolved into an X-axis linear component 20, and a Y-axis linear component 21, which represent the normal polarization modes for linear birefringence.

These orthogonal vectors 20,21 increase and decrease in magnitude, from positive to negative, along the shaded portions of their respective axes, as the lightwave represented thereby propagates, so that the resultant vector 16 correspondingly increases and decreases in magnitude, from positive to negative, along the shaded portions of the diagonal line labeled D. If these oscillations of the vectors 20,21 are in phase, the polarization of the lightwave is linear, while, if they are out of phase, the polarization of the lightwave has a degree of ellipticity. The direction of polarization (i.e., the principal axis of the ellipse) is determined by the relative magnitudes of the vectors 20,21. For example, assuming the vectors 20,21 are oscillating in phase, with equal magnitudes, the direction of polarization will be 45 degrees, and the state of polarization will be linear, as shown in FIG. 4.

In addition to the foregoing, it should be presently understood that fiber birefringence can effect the ellipticity of polarization and the direction of polarization. Linear birefringence increases the propagation velocity of the light in one of the normal polarization modes, while decreasing it in the other normal mode, thereby causing the phase of the orthogonal field vectors 20,21 (FIG. 5) to change relative to each other. Thus, linear birefringence will result in a change in the ellipticity of polarization. However, under certain circumstances, linear birefringence, in addition to changing the ellipticity of polarization, can also yield a change in the direction of polarization. This may be more fully understood by referring to FIG. 5, which schematically shows the vectors 16,20,21 discussed in reference to FIG. 4 for lightwave that is linearly polarized in a direction which is inclined, from the vertical, in the clockwise direction. As the linearly polarized lightwave, represented by the vector 16, encounters linear birefringence, the degree of ellipticity of its polarization will begin to increase. Assuming the linear birefringence provides a phase difference between the normal mode components, represented by the vectors 20,21 (FIG. 4), equal to one-quarter wavelength, the polarization will increase in ellipticity until it becomes a maximum. At this point, additional linear birefringence will cause the polarization to decrease in ellipticity. If the birefringence is sufficient to provide a phase difference between the normal mode components 20,21 (FIG. 5) of one-half wavelength (i.e., 180 degrees), the polarization will again be linear (zero ellipticity). However, it will be reoriented so that it is now inclined in the opposite direction from the vertical, i.e., 30 degrees in the counter-clockwise direction, as shown in phantom in FIG. 5 by the vector 16. Thus, by introducing sufficient linear birefringence to provide a phase difference between the normal mode components equal to 180 degrees (or one-half wavelength), the direction of a linearly polarized wave can be changed so that it is inclined from the Y-axis in the opposite direction by an equal amount.

Circular birefringence is analogous to linear birefringence in that it, causes the propagation velocity in one of the normal, circular polarization modes to be increased, while the other is decreased. This causes the two counter-rotating field vectors 12,14 (FIGS. 1-3) of the two respective normal polarization modes to rotate at different velocities (i.e., retarding the phase of one, while advancing the phase of the other), and thereby rotates the direction of polarization. Thus, as a general rule, circular birefringence changes the direction of polarization, while linear birefringence changes the degree of ellipticity of the polarization, and, as noted above, can also, under certain circumstances, change the direction of polarization.

When a combination of linear birefringence and circular birefringence is present at a point on an optical fiber, the birefringence at this point may be referred to as elliptical birefringence. Such elliptical birefringence involves a different set of normal modes than either of those discussed above. Further, the elliptical birefringence affects the polarization of light in a more complex manner which depends, in part, upon the magnitude of the linear birefringence relative to the magnitude of the circular birefringence. For present purposes, it will be sufficient to understand that, if the linear and circular components of the elliptical birefringence are substantially equal, there may be a relatively large effect on the state of polarization which will be substantially greater than what would occur if only the linear birefringence portion were present.

There are a number of sources of birefringence. For example, all presently available optical fibers have a certain amount of residual linear birefringence due to stresses created in the fiber during the manufacturing process. In addition, linear birefringence can be created by bending the fiber to create stress therein. Circular birefringence, on the other hand, may be created in a fiber by exposing the fiber to a magnetic field. The amount of birefringence so created is a function of the B field in a direction parallel to the fiber. Thus, the Faraday effect is essentially a circular birefringence effect. Another method of creating circular birefringence involves twisting the fiber. It should be noted, however, that twisting induced birefringence, for a system such as an interferometer, provides a "reciprocal effect". That is, the twist causes the polarization of the light to be rotated, from the viewpoint of a stationary observer, clockwise in one propagation direction, and counter-clockwise in the other propagation direction. In contrast, magneto-optic (Faraday) rotation causes light of a given polarization to rotate in the same direction, as viewed by an observer, regardless of the direction of propagation. Thus, such Faraday rotation will be referred to as being a "non-reciprocal" effect. In this regard, it will also be understood that the effect of linear birefringence produces a reciprocal, rather than non-reciprocal, effect.

THE FARADAY EFFECT IN OPTICAL FIBERS

Figure 6:
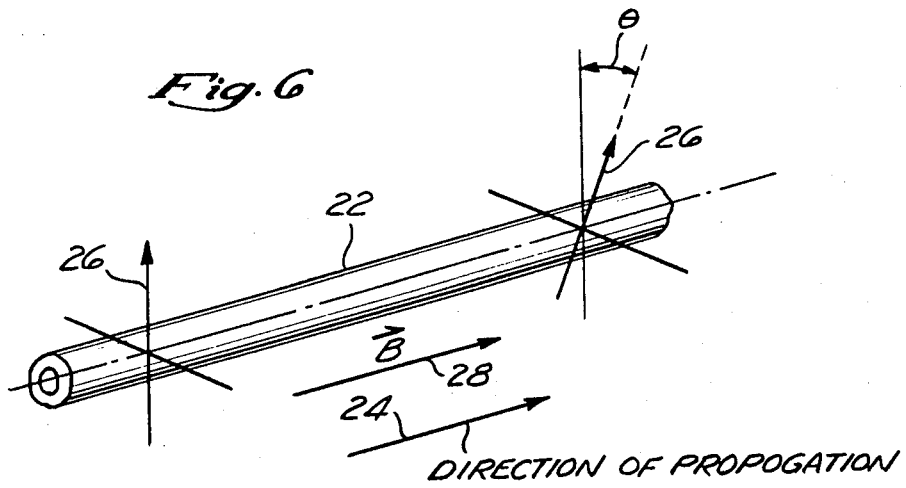
FIG. 6 is a schematic drawing of a lightwave propagating along a length of optical fiber, showing the polarization of the lightwave rotated, in accordance with the Faraday effect, due to the presence of a magnetic field.
Figure 7:
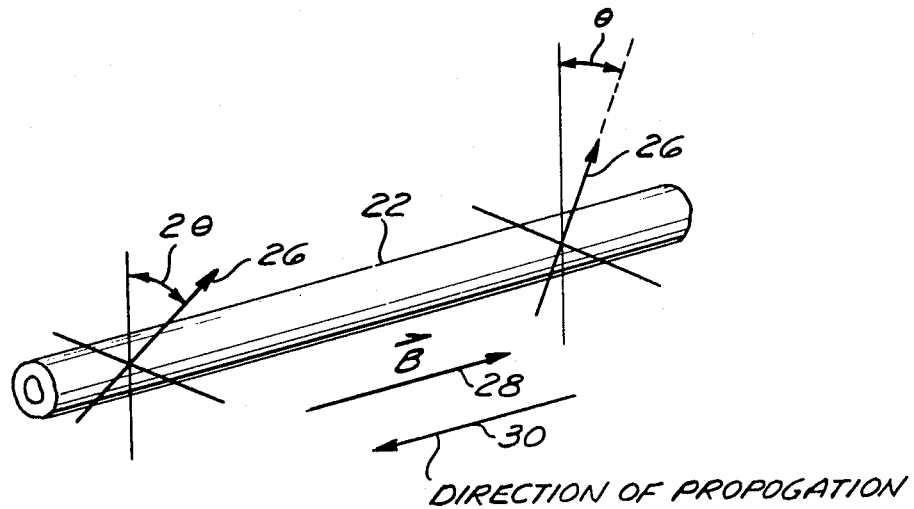
FIG. 7 is a schematic drawing of the lightwave and optical fiber of FIG. 6, showing the polarization of the lightwave rotated, in the same direction as in FIG. 6, when the lightwave propagates back through the fiber (i.e., with the propagation direction opposite that shown in FIG. 6)

The Faraday effect in optical fibers will now be described. Accordingly, there is shown in FIG. 6 a length of optical fiber 22 having a lightwave propagating therethrough in the direction indicated by the arrow 24. It will be assumed, for the purposes of this discussion, that the lightwave is linearly polarized, as represented by the electric field vector 26. As previously indicated, a Faraday effect may be induced in the optical fiber by applying a magnetic field (B field) parallel to the direction of propagation, as represented by the arrow 28. Such magnetic field 28 advances the propagation velocity of the lightwave for one of the two circular polarization modes, while retarding it for the other. Referring back to FIG. 1, the effect of such differential change in propagation velocity is to advance the phase of, e.g., the field vector 14, and retard the phase of the field vector 12, thereby causing the direction of the resultant vector 16 to rotate by an amount commensurate with the differential change in propagation velocity, in the rotational direction of the vector 14. Thus, as shown in FIG. 6, the vector 26, in like manner, will rotate through an angle $\theta$ due to the influence of the magnetic field 28. If the wave represented by the vector 26 propagates through a system, such as an interferometer loop (not shown), the wave 26 will return to the fiber 22, and again propagate therethrough, as shown in FIG. 7. If it is assumed that the interferometer system does not affect the polarization of the wave 26, so that this wave will enter the fiber 22 with the same polarization as when it left, i.e., linear, inclined from the vertical by an angle of $\theta$, the direction of propagation 30 of the wave 26, when it makes this second pass through the fiber 22, will be opposite the direction of the magnetic field 28. This affects the field vectors 12,14 (FIG. 1) in the opposite manner as occurred when the wave 26 was propagating in the same direction as the magnetic field 28. That is, the resultant vector 16 (FIG. 1) will rotate in the direction of the component vector 12, rather than the component vector 14. Thus, the direction of polarization of the lightwave 26 will be rotated, from the viewpoint of the lightwave, in a clockwise direction for one propagation direction, and in a counter-clockwise direction for the other propagation direction. However, from the viewpoint of a stationary observer, the polarization of the wave 26 will appear to rotate in the same direction, regardless of the direction of propagation. Thus, if the polarization of the wave 26 is rotated through an angle $\theta$ on its return through the fiber 22, the total rotation will be equal to $2\theta$, as shown in FIG. 7.

As previously mentioned, optical fibers typically have a low Verdet constant, and therefore, unless huge magnetic fields or long lengths of fiber are utilized, the angle $\theta$ will be small. Consequently, as indicated above, it has been difficult to achieve significant Faraday rotation in optical fibers.

THE FARADAY EFFECT IN A FIBER LOOP

Figure 8:
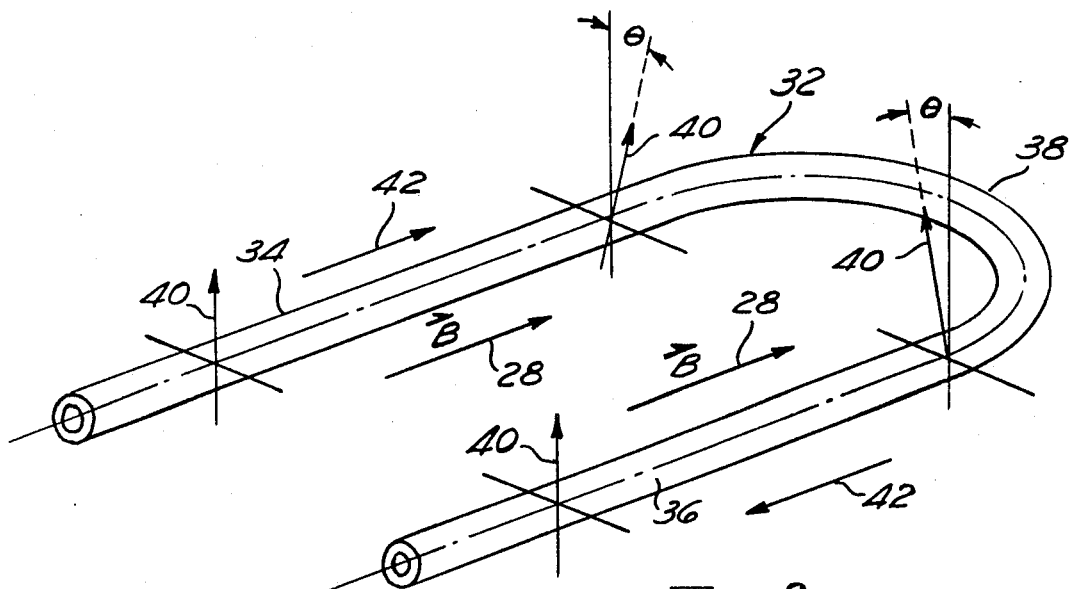
FIG. 8 is a schematic drawing of a lightwave propagating through a loop of optical fiber, showing the polarization rotated in accordance with the Faraday effect, and illustrating that, absent the proper amount of birefringence in the curved portions of the fiber, the Faraday rotations induced by a magnetic field cancel as the wave propagates through the loop.

By bending a fiber, such as the fiber 32, shown in FIG. 8, to form a loop, a significantly greater portion of the fiber can be exposed to a given magnetic field, such as the field represented by the arrows 28. The fiber loop 32 is formed so that it has two straight portions 34,36, with a curved portion 38 therebetween. The straight portions 34,36 are oriented in a direction parallel to the magnetic field 28 so that the Faraday effect is present in these portions of the fiber. For purposes of the present discussion, linear fiber birefringence (e.g., induced by the bend 38) will be ignored. Further, it will be assumed that a linearly polarized lightwave, represented by the electric field vector 40, propagates through the fiber 32, in the direction of the arrows 42, and that the magnetic field 28 rotates the direction of polarization of the light 40, due to the Faraday effect, by an angle $\theta$ in each of the straight portions 34,36 of the fiber 32. It will be recalled from the discussion in reference to FIGS. 6 and 7 that the magnetic field 28 rotates the vector 40 in one direction, e.g., clockwise, when the direction of propagation 42 is the same as that of the magnetic field 28, while rotating the vector 40 in the opposite direction, e.g., counter-clockwise (from the viewpoint of the lightwave), when the propagation direction 42 is opposite that of the magnetic field 28. Moreover, in contrast to the situation described in FIG. 7 (i.e., where the light returning for propagation back through the fiber 22 was the same, from the viewpoint of a stationary observer, as that leaving the fiber), it may be seen from FIG. 8 that, from the viewpoint of a stationary observer, the light leaving the straight portion 34 has a polarization that is inclined from the vertical in the opposite direction as that entering the straight portion 36. This is due to the geometry of the fiber, as may be understood by visualizing the vector 40 as it traverses the curved portion 38. Thus, the clockwise and counter-clockwise rotations in the straight portions 34,36 (as seen by the lightwave 40) will cancel each other so that when the lightwave 40 exits the straight portion 36, it has the same polarization as when it entered the straight portion 34, i.e., linear, with a vertical orientation. Thus, by bending the fiber into the loop 32, the net overall Faraday rotation is zero.

It should be emphasized that the foregoing discussion is over-simplified in that it ignores the effect of linear birefringence created in the curved portion 38 by bending the fiber 32. Such linear birefringence will cause the polarization of the light to be modified in a very advantageous manner. Specifically, it has been found that by precisely controlling the amount of linear birefringence created by forming the curved portion 38, such linear birefringence may be utilized to cause the Faraday rotations in the straight portions 34,36 to add to each other, rather than cancel.

UTILIZING LINEAR BIREFRINGENCE TO PROVIDE ADDITIVE FARADAY ROTATION

Figure 9:
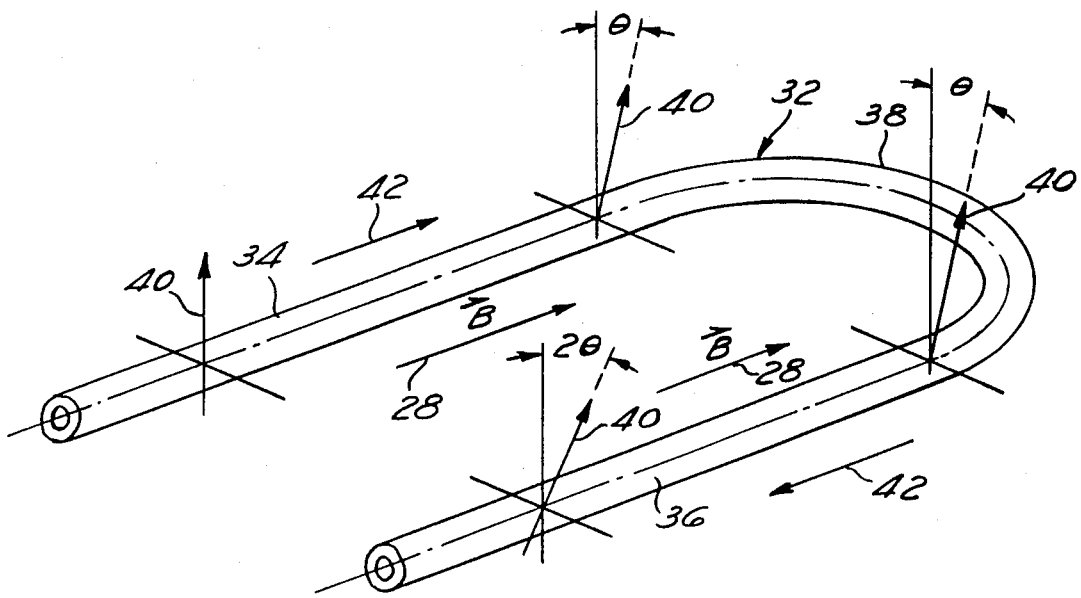
FIG. 9 is a schematic drawing of the lightwave and fiber loop of FIG. 8, except that the curved portion of the fiber of FIG. 9 has sufficient linear birefringence to transform the direction of polarization so that, from the viewpoint of a fixed observer, the polarization in both of the straight portions is the same, thereby causing the Faraday rotations to add to each other, rather than cancel.

The fiber loop 32, discussed in reference to FIG. 8, is also shown in FIG. 9. However, FIG. 9, unlike FIG. 8, illustrates the effect of linear birefringence induced by the bend (curved portion 38) in the loop 32. The curved portion 38 has a radius of curvature selected to provide a spatial separation of one-half wavelength, or a phase difference of 180 (or an odd integer multiple thereof) degrees, between the light in the two orthogonal polarization modes. The effect of this birefringence-induced 180-degree phase difference is to change the direction of polarization, from the perspective of the lightwave, so that, instead of being inclined in a clockwise direction from the vertical axis by the angle θ, it is inclined in a counter-clockwise direction from the vertical axis by the angle θ. Stated another way, from the viewpoint of a stationary observer, the polarization of the wave 40 will appear the same for the light leaving the straight portion 34 as for the light entering the straight portion 36. Since the Faraday rotation is in the same direction, when viewed by a stationary observer, for both straight portions 34, 36, the Faraday rotation through the portion 36 will add to that from the portion 34, and therefore, the wave 40, upon exiting the straight portion 36, will have a direction of polarization which is inclined by the angle 2θ from the vertical. In such manner, the linear birefringence produced in the curved portion 38 of the fiber 32 may be advantageously utilized to cause the Faraday rotations in the straight portions 34, 36 to add to each other. Further, even through the angle 2θ, due to Faraday rotation in the loop 32, may be small, it will be understood that, by providing a series of loops, a much larger Faraday rotation may be obtained.

Figure 10A:
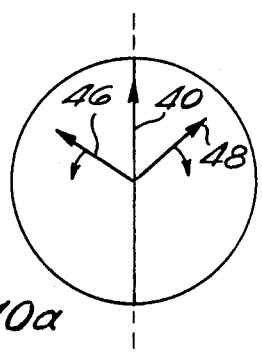
FIGS. 10A through F are schematic illustrations of a linearly polarized lightwave, showing the effects of birefringence upon this lightwave as it propagates through the fiber loop of FIG. 9.
Figure 10B:
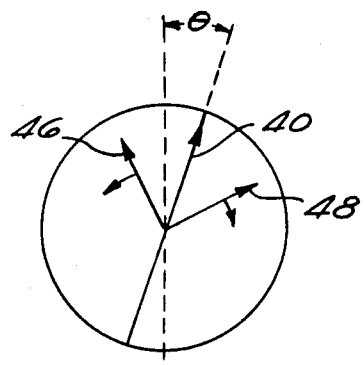
Figure 10C:
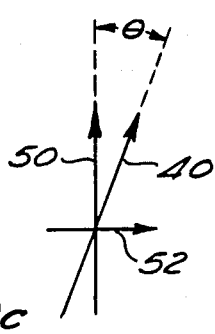
Figure 10D:
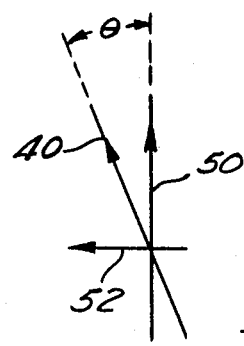
Figure 10E:
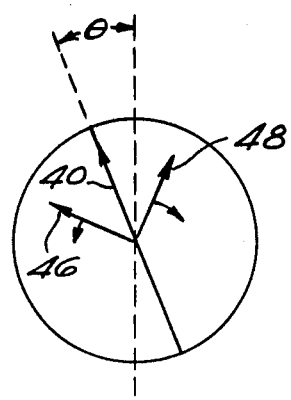
Figure 10F:
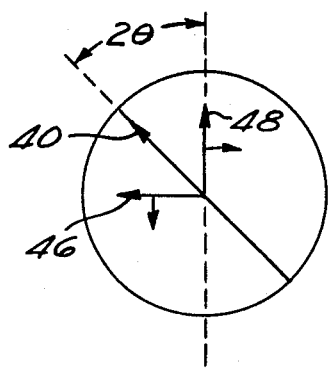

The above-described changes in polarization of the wave 40 may be understood more fully through reference to FIGS. 10A through 10F, which illustrate the wave 40 from the viewpoint of the wave front, rather than from the viewpoint of a fixed observer. FIG. 10A shows the lightwave, represented by the vector 40, as it enters the straight portion 34 (FIG. 9), with a vertical, linear polarization. The vector is shown as being the resultant of two counter-rotating vectors 46, 48, as is appropriate for illustrating the effect of the circular birefringence induced by the magnetic field 28 (FIG. 9) in the straight portion 34. As the wave 40 propagates through the straight portion 34, the phase of one of the counter-rotating vectors, e.g., the vector 46, is retarded, while the phase of the other vector 48 is advanced. The result of the differential phase change of the vectors 46, 48 is to incline the direction of polarization from the vertical, e.g., in a clockwise direction, by an angle θ, as shown in FIG. 10B. As the wave 40 enters the curved portion 38, it encounters linear birefringence and thus it is appropriate to express the vector 40 in terms of the normal modes for linear birefringence. Accordingly, the vector 40 of FIG. 10B is shown in FIG. 10C as being the sum of two linearly polarized orthogonal vectors 50, 52. As the wave 40 transverses the curved portion 38, the phase of one of the polarization modes is advanced, while the other is retarded, so that the phase therebetween is shifted by 180 degrees. This affects the polarization of the wave 40 in the manner described in regard to FIG. 5, so that upon exiting the curved portion 38, the wave 40 now has a direction of polarization, inclined by the angle θ, in a direction opposite that when it entered the loop, e.g., counter-clockwise, as shown in FIG. 10D. Since the wave 40 is now beginning its traverse through the straight portion 36, in which circular birefringence is induced by the magnetic field 28, it is again appropriate to change coordinate systems, so that the vector 40 of FIG. 10D is again represented by the counter-rotating vectors 46, 48, as shown in FIG. 10E. Because the direction of propagation for the wave 40, as it traverses the straight portion 36, is contra-directional to the magnetic field 28, the vector 46 will be advanced, rather than retarded, and the phase of the vector 48 will be retarded, rather than advanced. The effect of this differential phase change of the vectors 46, 48 is to rotate the resultant vector 40 in a counter-clockwise direction through an angle θ, as shown in FIG. 10F, so that the vector 40 is now inclined from the vertical by an angle 2θ.

WRAPPING THE FIBER WITH ADJACENT LOOPS IN ORTHOGONAL PLANES TO PROVIDE ERROR COMPENSATION

Figure 11:
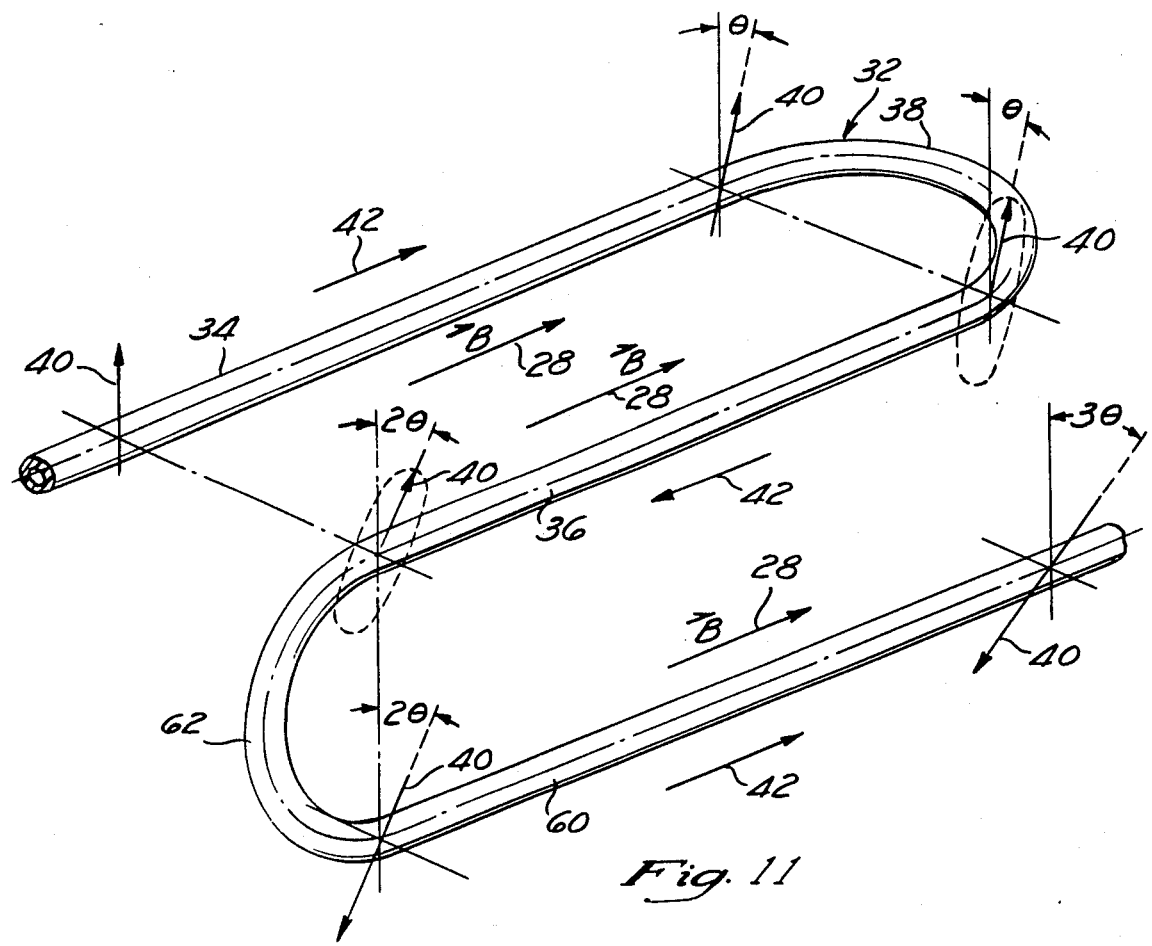
FIG. 11 is a schematic drawing showing two fiber loops, lying in mutually orthogonal planes, and illustrating the polarization error compensation provided by orienting the fiber loops in orthogonal planes.
Figure 13:
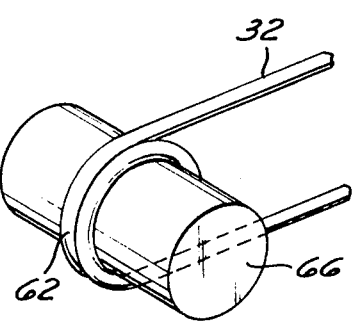
FIG. 13 is a schematic drawing showing a fiber wrapped 1½ turns about one of the cylindrical forms of FIG. 12.

The fiber loop 32, discussed in reference to FIGS. 8 and 9, is also shown in FIG. 11. However, in FIG. 11, the fiber 32 is shown as having an additional loop comprising an additional straight portion 60, and an additional curved portion 62, joining the straight portion 60 with the straight portion 36. The loops are oriented so that the loop formed by the straight portions 34, 36 and curved portion 38 lie in a horizontal plane, while the loop formed by the straight portions 36, 60 and curved portion 62 lie in a vertical plane. It is advantageous to wrap the fiber 32 in this manner, i.e., with adjacent loops lying in orthogonal planes, since this provides compensation for polarization errors caused by too much or too little birefringence in the curved portions 38, 62. It will be recalled from the discussion in reference to FIGS. 5 and 10 that the curved portions should have a radius of curvature which induces sufficient birefringence to provide a spatial separation of one-half wavelength or phase difference of 180 degree for light propagating in the normal polarization modes. Assuming, for example, that the radius of curvature of the curved portion 38 is such that this phase difference is slightly more or less than 180 degrees, the degree of ellipticity of the polarization of the lightwave 40 will change as it traverses the curved portion 38, e.g., from linear to slightly elliptical, as illustrated in FIG. 11. As the wave 40 propagates through the straight portion 36, it will undergo a Faraday rotation, so that the principal axis of the elliptical polarization is inclined from the vertical by 2θ, upon reaching the curved portion 62. However, the polarization of the wave 40 at this point will be in this same elliptical state (ignoring, for the moment, residual fiber birefringence), since Faraday rotation does not affect the degree of ellipticity of the polarization. Assuming that the radius of curvature of the curved portion 62 is exactly the same as that of the curved portion 38, as the wave 40 traverses the curved portion 62, its polarization will return to linear. This occurs because the curved portion 62 lies in a plane orthogonal to that of the curved portion 38, and thus, the normal polarization modes are affected in the opposite manner in the portion 62, as in the portion 38. For example, assuming that the curved portion 38 increases the propagation velocity of a first mode, while decreasing it in a second mode, the curved portion 62, being orthogonal to the curved portion 38, will decrease the propagation velocity in the first mode and increase it in the second mode. Thus, the linear birefringence of the curved portion 62 shifts the phase of the light in each of the normal modes in a direction opposite from that in the curved portion 38, but by an equal amount. Therefore, the linear birefringence of the curved portion 62 will compensate the birefringence of the curved portion 38, so that the wave 40 returns to a substantially linearly polarized state. Finally, the wave 40 then propagates through the straight portion 60, where it undergoes another Faraday rotation, so that the direction of polarization is inclined from the vertical by 3θ upon exiting the straight portion 60.

It will be understood that the curved portions 38, 62, and straight portions 34, 36, 60 may be formed by wrapping the fiber 32 about a suitable form or mandrel. A description of such form or mandrel will be provided subsequently.

The advantages of wrapping the fiber 32 in the above-described manner will become more apparent by considering a fiber that is wrapped with the loops in substantially parallel planes. If this were the case, each curved portion would affect the two polarization modes in the same manner, i.e., each increasing the propagation velocity of one mode, while decreasing the other. Assuming that the loops are all equal in size, with a radius of curvature slightly larger or smaller than that necessary to provide a phase difference of 180 degrees, each loop will change the state of polarization in an additive manner so as to gradually increase the degree of ellipticity of a linearly-polarized input wave. When the ellipticity of the wave reaches a maximum for the direction of polarization under consideration, the direction of polarization will change so that it is inclined in the opposite direction from the vertical, in the manner discussed above in reference to FIG. 5. This is disadvantageous, particularly since any further Faraday rotations will tend to cancel the previously accumulated Faraday rotations.

Another advantage of wrapping the fiber with adjacent loops in orthogonal planes, as described above, is that it permits light of different wavelengths to be utilized without changing the radius of curvature of the curved portions 38, 62. Since the radius of curvature necessary to provide the desires 180-degree phase difference between light in the two polarization modes is dependent upon the wavelength of the light utilized, use of a wavelength that is not properly matched to the radius of curvature will yield the same type of errors with respect to the state of polarization, as result from utilizing fiber bends (i.e., the curved portions 38, 62) that are too large or too small. However, since wrapping the fiber with adjacent loops in orthogonal planes tend to cancel these errors, the present invention can tolerate use of light having a wavelength that is not precisely matched to the linear birefringence of the curved portions 38, 62.

THE EFFECTS OF RESIDUAL LINEAR BIREFRINGENCE OF THE FIBER

The discussion heretofore, in reference to FIGS. 1-11, has ignored the effects of residual linear birefringence of the fiber 32. For the curved portions 38 and 62, such birefringence is negligible, since the linear birefringence induced by bending the fiber is usually at least ten times larger than the residual birefringence. In the straight portions 34, 36, 60, however, this residual birefringence is not necessarily negligible. It will be recalled from the above "polarization analysis" discussion that, if both linear birefringence and circular birefringence are present at a particular point in the fiber, this combination of birefringence results in elliptical birefringence, which can yield a substantial change in the state (e.g. degree of ellipticity) of polarization, particularly if there are equal amounts of linear and circular birefringence. Since circular birefringence exists in each of the straight portions 34, 36, 60 due to the Faraday effect, and residual linear birefringence exists throughout the fiber 32, elliptical birefringence may exist in the straight portions 34, 36, 60. The effects of such linear birefringence may be reduced by utilizing a fiber having low residual birefringence, so that the circular birefringence, due to the Faraday effect, is several times larger than the residual linear birefringence of the fiber. Preferably, the residual linear birefringence of the fiber 32 should be at least e.g., five to ten times less than the circular birefringence in the straight portions 34, 36, 60.

In cases where the desired ratio of circular to residual linear birefringence cannot be achieved, the amount of circular birefringence in the straight portions 34, 36, 60 may be increased by twisting the straight portions of the fiber during wrapping so that, in effect, the twisting-induced circular birefringence overwhelms the residual linear birefringence. This advantageously reduces the effects of the residual linear birefringence of the fiber. The amount of rotation of the direction of polarization resulting from such twisting is equal to about 7 percent of the amount that the fiber is rotated by the twisting. It will be understood that the rotation induced by the twist is reciprocal, in contrast to the Faraday rotation, which is non-reciprocal. Thus, whatever rotation is induced by the twist in one direction of propagation will be cancelled by the twist-induced rotation for the other direction of propagation. Therefore, if a lightwave propagates twice through the fiber, once in each direction, the amount of rotation of the direction of polarization of such lightwave will be equal to the amount of Faraday rotation.

THE RADIUS OF CURVATURE OF THE CURVED PORTIONS

Figure 12:
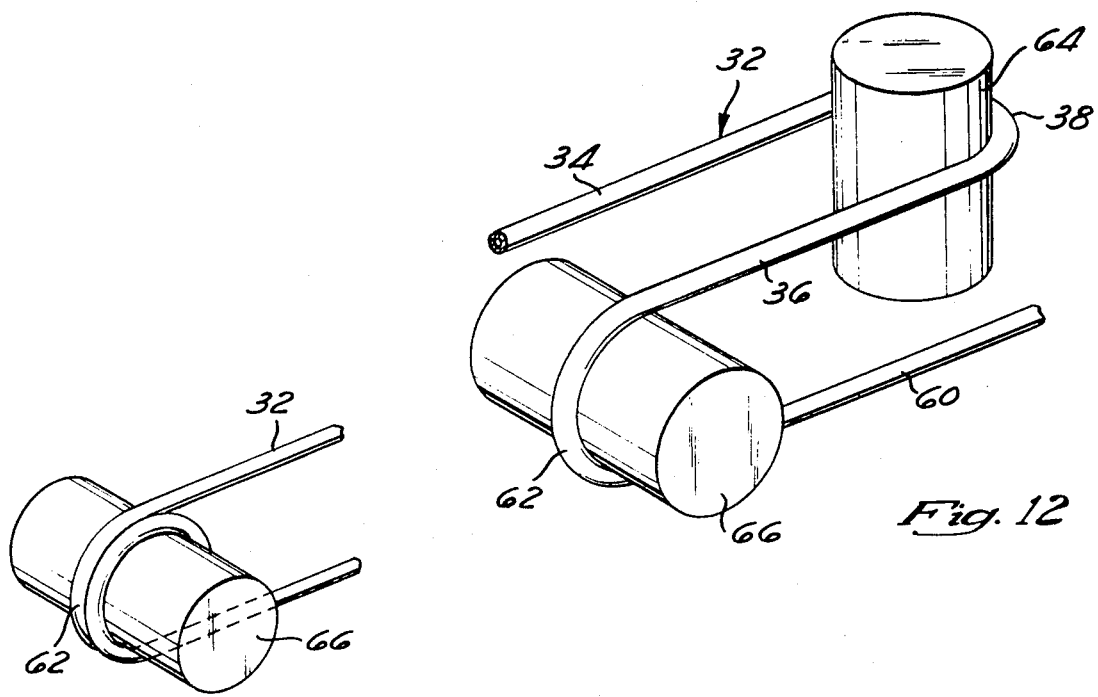
FIG. 12 is a schematic drawing illustrating the fiber loops of FIG. 11 wrapped around cylindrical forms, sized to provide the desired radius of curvature for the curved portions of the loops.

As shown schematically in FIG. 12, the curved portions 38, 62 may be formed by wrapping the fiber 32 about a pair of orthogonally oriented cylindrical forms 64, 66, respectively. The forms 64, 66 have a radius selected to provide a radius of curvature for the curved portions 38, 62 which yields the desired 180-degree phase difference (one-half wavelength) between light in the two orthogonal modes. This radius of curvature for the curved portions 38, 62 is dependent upon whether the fiber 32 is wrapped with or without tension in the straight portions 34, 36, 60.

Considering first wrapping the fiber 32 without tension, the radius of curvature of the curved portions may be calculated utilizing the following equation:

$$R = 4\pi a r^2 N/\lambda \qquad (1)$$

where a is a constant dependent upon the photoelastic coefficient of the fiber, r is the radius of the fiber, N is the number of turns (e.g, about the cylindrical forms), and $\lambda$ is the wavelength of the light. Assuming a silica fiber and a wavelength of 0.633 microns are utilized, the value of the constant "a" will be 0.133. If it is further assumed that the fiber has a radius of 55 microns, Equation 1 reduces to:

$$R = 0.8N \qquad (2)$$

From Equation 2 it will be understood that, for a given fiber and a given wavelength of light, the radius of curvature (R) is a function of the number of turns (N). Assuming the fiber is wrapped one-half turn about the cylindrical forms, as shown in FIG. 12, the radius of curvature will be 0.4 centimeters. Those skilled in the art will recognize that this is a relatively tight radius which may cause the guided modes to become unguided, thereby resulting in loss of light energy. In order to avoid these losses, the fiber 32 may be wrapped with additional turns about the cylindrical forms 64, 66, e.g., 1½ turns, as illustrated for the curved portion 62 in FIG. 13. Increasing the number of turns in this manner permits the radius of curvature to be increased, e.g., to 1.2 centimeters, as is apparent from Equation 2.

If, rather than wrapping the fiber without tension, as described above, the fiber 32 is instead wrapped with tension, the radius of curvature required to provide the desired spatial separation of $\lambda/2$ (i.e., 180 degrees), will be larger than that defined by Equation 2, since such tension creates additional stresses in the curved portions, and thus, additional linear birefringence, which adds to the birefringence created by bending the fiber to form the curved portions.

In order to provide a spatial separation between light in the two orthogonal polarization modes equal to one-half wavelength ($\lambda/2$), the spatial separation due to bending the fiber ($\lambda/k$) should add to the spatial separation due to tensioning the fiber ($\lambda/m$), so that their sum is equal to one-half wavelength. That is:

$$\frac{\lambda}{k} + \frac{\lambda}{m} = \frac{\lambda}{2} \qquad (3)$$

For example, if k=3 and m=6, the bending will yield a spatial separation of $\lambda/3$, while the tensioning will yield a spatial separation of $\lambda/6$ for a total spatial separation of 80 /2. Thus, the values of k and m are chosen to satisfy Equation 3.

For a given value of k, the radius of curvature (R) required is defined by the following equation:

$$R = 2\pi a r^2 Nk/\lambda \qquad (4)$$

In addition, for a given value of m, the tensile force (F) required is defined by:

$$F = \lambda E r / 2\pi N a \alpha m \qquad (5)$$

where E is Young's modulus, and $\alpha$ is a coefficient, depending upon the shape of the fiber, which, for a round fiber of fused silica, is about 1.8. As an aside, it will be understood that Equation 4 is a more general form of Equation 1, and that substituting k=2 into Equation 4 will yield Equation 1.

Thus, by utilizing Equations 3, 4 and 5, the proper combination of tensile force and radius of curvature necessary to provide a spatial separation of one-half wavelength (i.e., 180 degrees) may be determined. It is significant that, by utilizing tension-induced birefringence, the radius of curvature, for a given number of turns, will be larger than would otherwise be necessary to produce the desired one-half wavelength spatial separation. Accordingly, by properly tensioning the fiber, it is possible to wrap the fiber with half turns and utilize a radius of curvature sufficiently large to prevent energy loss due to bending.

A further advantage of wrapping the fiber 32 with tension is illustrated in FIG. 14, which shows the curved portion 62 wrapped one-half turn on the cylindrical form 66. The position of the fiber 32, when wrapped without tension, is illustrated in solid lines, while the position of the fiber 32, when wrapped with tension, is illustrated in phantom lines. It will be understood that the relative positions of the fiber with and without tension are exaggerated in this drawing for purposes of illustration. From FIG. 14 it can be seen that, when the fiber is wrapped without tension, there is a gentle bend in each of the straight portions 36, 60 adjacent the curved portion 62, due to the elasticity of the fiber. These gentle bends introduce a small amount of linear birefringence at the ends, designated by the reference numeral 69, of the straight portions 36, 60. As previously indicated, such linear birefringence can combine with the circular birefringence in the straight portions 36, 60 to produce undesirable elliptical birefringence. However, by tensioning the fiber 32, as shown in phantom lines, these gradual bends and associated linear birefringence are substantially eliminated, thereby reducing or eliminating the elliptical birefringence.

It wil be understood that tensioning the fiber 32 does not introduce birefringence into the straight portions 36, 60, since the stresses created by such tension in these straight portions are isotropically distributed through the fiber, in a plane orthogonal to the direction of propagation.

WRAPPING THE FIBER ON A MANDREL

As shown in FIG. 15, the fiber 32 may be wrapped upon a mandrel 70 to provide a series of loops having curved portions and straight portions, such as the curved portions 38, 62 and straight portions 34, 36, and 60 (FIG. 12). The mandrel 70 is made from a nonferrous material, such as aluminum, and comprises a central bar portion 72, square in cross-section. A pair of cylindrical potions 74, 76 are formed at the respective ends of the central portion 72, and perpendicular thereto. The cylindrical portions 74, 76 are oriented so that they are mutually perpendicular. As viewed in FIG. 15, the cylindrical portion 74 has a right end 75(a) and left end 75(b), projecting from respective parallel sides of the central portion 72. Similarly, the cylindrical portion 76 has an upper end 77(a) and lower end 77(b), projecting from respective parallel sides of the central portion 72. Further, the cylindrical portions 74, 76 have diameters which are equal to or larger than the sides of the central portion 72.

The fiber 32 is first wrapped around the upper end 77a of the cylindrical portion 76 to form a curved fiber portion 78 joining two straight portions 80, 82. Next, the fiber is wrapped around the left end 75b of the horizontal cylindrical portion 74 to form a curved portion 83 joining the straight portion 82 with a straight portion 84. The wrapping continues by forming another curved portion 86 around the lower end 77b of the vertical cylindrical portion 76 to join the straight portion 84 to a straight portion 88. Finally, another curved portion 90 is formed, by wrapping the fiber 32 around the right end 75a of the horizontal portion 74 to join the straight portion 88 with a straight portion 92. It will be understood that the wrapping is accomplished so that the straight portions 80, 82, 84, 88 and 92 are parallel to each other. Further, by wrapping the fiber in the foregoing manner, the curved portions 78, 86 will lie in a horizontal plane, while the curved portions 83, 90 lie in a vertical plane. Thus, adjacent curved portions lie in orthogonal planes, and therefore, this manner of wrapping provides the error compensation discussed in reference to FIG. 11.

Although, for clarity of illustration, only four turns (curved portions) are provided in the fiber 32 of FIG. 12, it will be understoods that the fiber 32 may be wrapped in the same manner to provide additional turns. For example, in one embodiment which has been constructed, a total of 32 turns are utilized. The specifications for this embodiment are as follows:

| | |
|---|---|
| Number of curved portions | 32 |
| Number of straight portions | 33 |
| Length of one straight portion | 12 cm |
| Diameter of cylindrical form | 2.5 cm |
| Number of turns about the cylindrical form | 1.5 (as in FIG. 13) |
| Outside diameter of the fiber | 110 microns |
| Wavelength of the light | 0.633 microns |
| Total length of fiber | 4 meters (approx.) |
| Tension | wrapped without tension |
| Twists | wrapped without twists |

The mandrel 70, with the fiber 32 wrapped thereon, will be referred to collectively as the magnetic sensor 98.

A magnetic field may be applied to the fiber 32 by positioning the magnetic sensor 98 between the poles of a magnet 100, as shown in FIG. 16, so that the B field of this magnet is parallel to the straight portions of the fiber 32. The magnet 100 may be of any suitable type or shape. For example, it may be either an electro-magnet or permanent magnet. Further, the magnet may be e.g., shaped as a toroid, or as a horseshoe. If the strength of the magnetic field is approximately 1,000 gauss, a fiber wrapped according to the above specifications will provide a total Faraday rotation of 45 degrees for light propagating through the fiber in either direction. Thus, if a lightwave propagates through the fiber 32 in one direction, and returns therethrough in the other direction, the total Faraday rotation will be 90 degrees. It will be seen subsequently that this amount of Faraday rotation is particularly advantageous when utilizing the present invention as an optical isolator. The magnetic sensor 98 and magnet 100 will be referred to collectively as the magneto-optic rotator 102.

USE OF THE PRESENT INVENTION AS AN OPTICAL ISOLATOR

Figure 17:
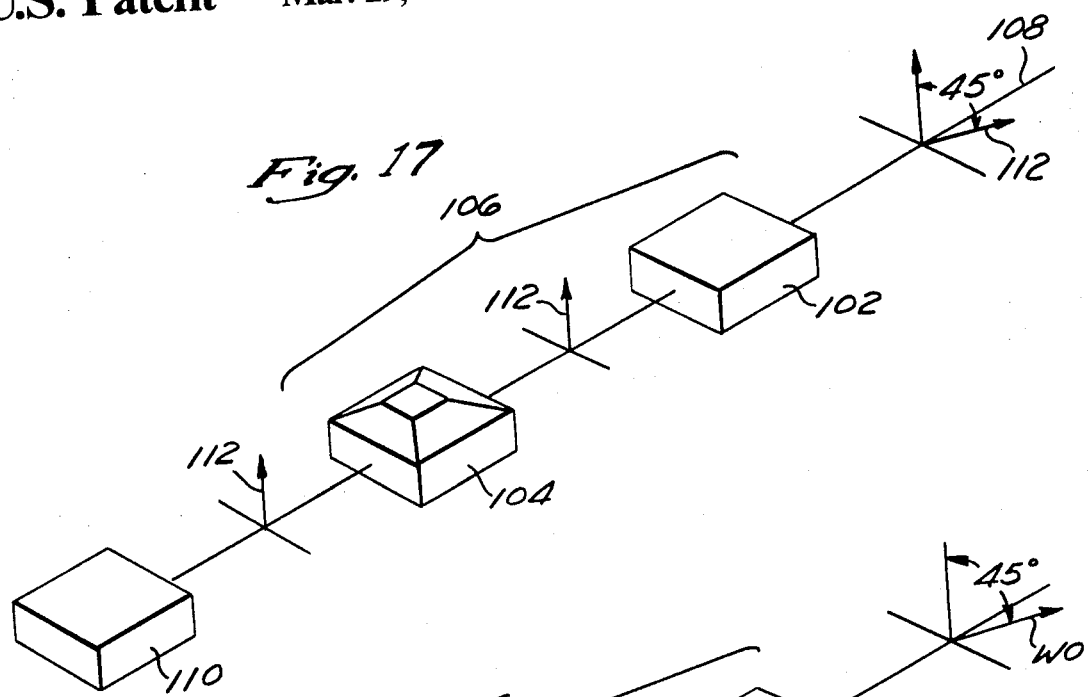
FIGS. 17 and 18 are schematic drawings showing the magneto-optic rotator of the present invention utilized as an optical isolator.

Referring to FIG. 17, the magneto-optic rotator 102 of the present invention may be used in combination with a polarizer 104 to form an optical isolator 106. Preferably, the rotator 102 and polarizer 104 are positioned along a continuous, uninterrupted strand of fiber optic material 108. Light is introduced into the optical fiber 108 by a light source 110.

The polarizer 104 is preferably oriented so that the polarization of the light passed thereby is matched to that produced by the light source 110, so that substantially all of the source light introduced into the fiber 108 passes through the polarizer 104 to the rotator 102. For the purposes of this discussion, it will be assumed that the light produced by the source 110 is linearly polarized in the vertical direction, and that the polarizer 104 passes this polarization, while rejecting the orthogonal polarization. This linearly polarized light is represented in FIG. 17 by the vector 112.

Figure 18:
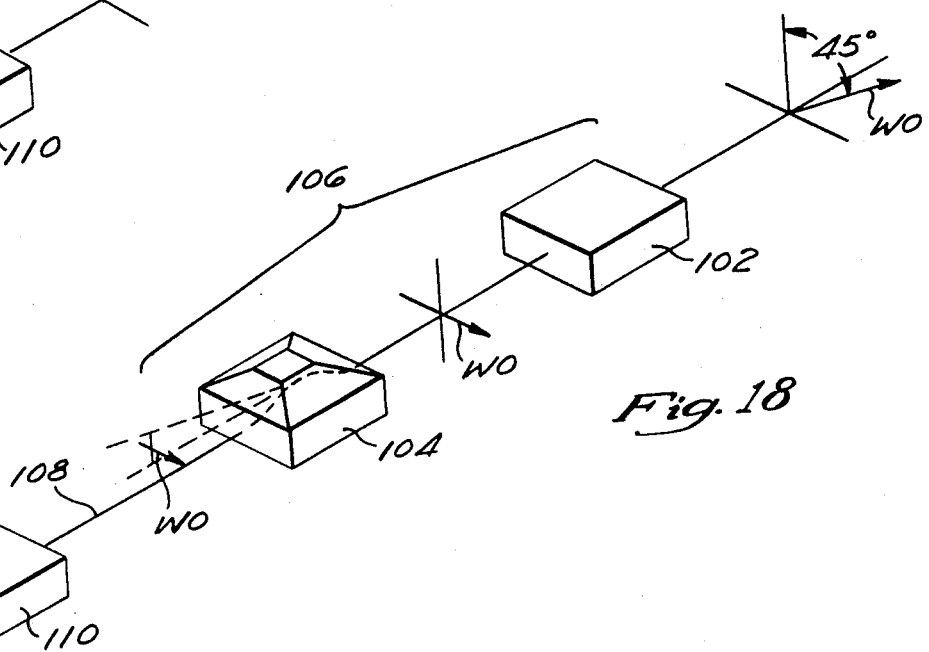

As seen from FIG. 17, the source light 112 produced by the source 110 is unchanged in polarization as it propagates through the polarizer 104. However, when the lightwave 112 passes through the rotator 102, its direction of polarization is rotated by 45 degrees. If the lightwave represented by the vector 112 propagates through the system, such an interferometer loop (not shown), the wave 112 will return to the fiber 108, and again propagate therethrough, as shown in FIG. 18. It will be assumed that the interferometer system does not affect the polarization of the wave 112, so that this wave will enter the fiber 108 with the same polarization as when it left, i.e., linear, inclined from the vertical by 45 degrees. Accordingly, as shown in FIG. 18, the lightwave 112 is shown as entering the rotator 102 with a polarization that is identical, from the point of view of an observer, to the polarization of the wave 112 (FIG. 16) when it left the rotator 102. When the wave 112 passes through the rotator 102, the direction of polarization will be rotated by another 45 degrees. Since the rotator 102 rotates the polarization in the same direction, from the viewpoint of a fixed observer, regardless of the direction of propagation, the first 45-degree rotation of the wave 112 will add to the second 45-degree rotation so that the wave 112 has a horizontal direction of polarization when it leaves the rotator 102. Since the polarizer 104 rejects polarizations which are orthogonal to those that it passes, the wave 112 will be prevented from propagating through the polarizer 104 to the light source 110. The polarizer 104 couples light from the fiber 108, so that it is emitted therefrom in a directional, diverging beam.

Figure 19:
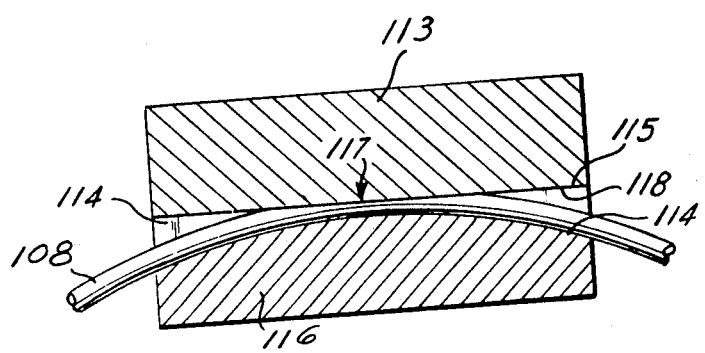
FIG. 19 is an elevation view, in partial cross-section, showing one type of fiber optic polarizer suitable for use with the magneto-optic rotator of the present invention, e.g., in the optical isolator of FIGS. 17 and 18.

Although various types of polarizers may be utilized, a polarizer particularly suitable for use in the isolator 106 of the present invention is illustrated in FIG. 19. This polarizer includes a birefringent crystal 113, positioned within the evanescent field of light transmitted by the fiber 108. The fiber 108 is mounted in a slot 114 which opens to the upper face 115 of a generally rectangular quartz block 116. The slot 114 has an arcuately curved bottom wall, and the fiber is mounted in the slot 114 so that it follows the contour of this bottom wall. The upper surface 115 of the block 116 is lapped to remove a portion of the cladding from the fiber 108 in a region 117. The crystal 113 is mounted on the block 116, with the lower surface 118 of the crystal facing the upper surface 115 of the block 116, to position the crystal 113 within the evanescent field of the fiber 108.

The relative indices of refraction of the fiber 108 and the birefringent material 113 are selected so that the wave velocity of the desired polarization mode is greater in the birefringent crystal 120 than in the fiber 108, while the wave velocity of an undesired polarization mode is greater in the fiber 108 than in the birefringent crystal 113. The light of the desired polarization mode (e.g., linear-vertical) remains guided by the core portion of the fiber 108, whereas light of the undesired polarization mode (e.g., linear-horizontal) is coupled from the fiber 108 to the birefringent crystal 113. Thus, the polarizer permits passage of light in one polarization mode, while preventing passage of light in the other, orthogonal polarization mode. Additional details of this polarizer are disclosed in U.S. Pat. No. 4,386,822, issued June 7, 1983 on application Ser. No. 195,934, filed Oct. 10, 1980, entitled "Polarizer and Method", assigned to the assignee of the present invention, which is hereby incorporated by reference herein.

USE OF THE PRESENT INVENTION AS A MODULATOR

Figure 20:
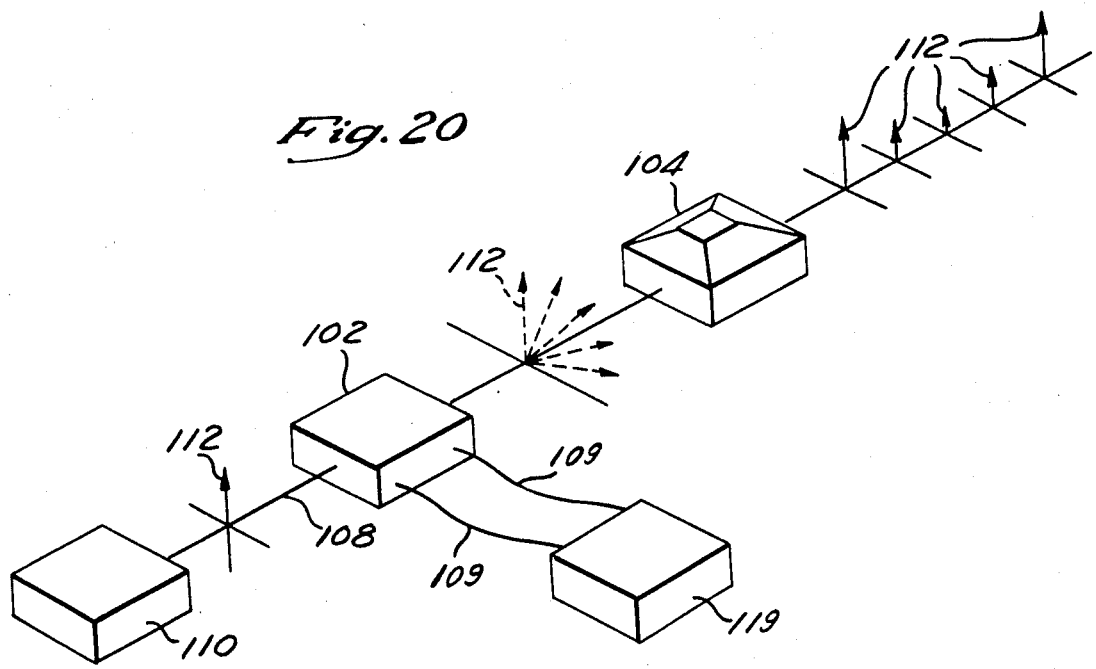
FIG. 20 is a schematic drawing showing the magneto-optic rotator of the present invention utilized as a modulator.

The present invention may be utilized as an amplitude modulator by interchanging the positions of the rotator 102 and polarizer 104 of FIG. 18, so that the rotator 102 is between the source 110 and polarizer 104, as shown in FIG. 20. Thus, the source light 112 from the source 110 propagates along the fiber 108, first to the rotator 102, and then to the polarizer 104. In this application, the magnet 100 (FIG. 16) of the rotator 102 is an electromagnet which is connected to a signal generator 119 by lines 109. Since the Faraday rotation provided by the rotator 102 is a function of the strength of the magnetic field of the magnet 100, the signal generator 119 may be utilized to vary the magnetic field, and thus, the Faraday rotation. Further, since the polarizer 104 permits passage of one polarization, e.g., linear-vertical, while rejecting the orthogonal polarization, e.g., linear-horizontal, variations in the amount of Faraday rotation will cause light passing through the polarizer 104 to correspondingly vary in amplitude, as illustrated in FIG. 19. In such manner, the rotator 102 of the present invention may be used as an amplitude modulator.

The embodiment of FIG. 20 may also be used as a phase modulator by removing the polarizer 104, and utilizing circularly polarized light, rather than linearly polarized light, as the source light 112. It will be recalled from the above "polarization analysis" discussion that the presence of a magnetic field oriented to provide a Faraday effect will change the phase of circularly polarized light. Thus, by varying the strength of the magnetic field by means of the signal generator 119, the phase of circularly polarized light will be correspondingly varied. In this manner, the rotator of the present invention may also be used as a phase modulator.

USE OF THE PRESENT INVENTION AS A MAGNETOMETER

The rotator 102 of the present invention may additionally be used as a magnetometer for sensing ambient magnetic fields, such as the earth's magnetic field. In this application, the magnet 100 (FIG. 16) is eliminated from the rotator 102, and only the magnetic sensor 98 (FIG. 15) is utilized. The magnetometer of the present invention is somewhat similar to a Sagnac interferometer, with its rotation sensing loop replaced by the magnetic sensor 98.

Figure 21:
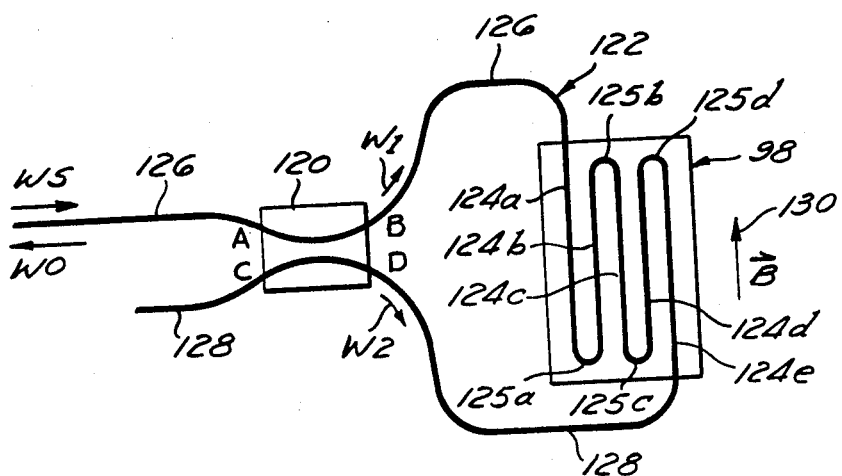
FIG. 21 is a schematic drawing showing the magneto-optic rotator of the present invention utilized as a magnetometer.

The principles underlying the operation of the magnetometer of the present invention will be developed through reference to FIG. 21. As shown therein, the magnetometer includes a fiber optic coupler 120 and the magnetic sensor 98. Although the magnetic sensor 98 is schematically illustrated in two dimensions, as comprising a fiber 122, wrapped to form five straight portions labeled 124A through E, respectively, it will be understood that the fiber 122 is actually wrapped in the manner discussed in reference to FIG. 15, preferably with additional turns, forming additional straight portions, to increase the sensitivity of the sensor 98 to magnetic fields. Adjacent ones of the straight portions 124 are joined by respective curved portions 125, i.e., with a curved portion 125(a) between the straight portions 124(a) and (b), a curved portion 125(b) between the straight portions 124(b) and (c), a curved portion 125(c) between the straight portions 124(c) and (d), and a curved portion 125(d) between the straight portions 124(d) and (e). The portions 126, 128 of the fiber 122, which project from opposite ends of the magnetic sensor 98, respectively, pass through ports labeled B and D, respectively, on one side of the coupler 120. The fiber portions 126, 128 project from the other side of the coupler, through ports labeled A and C, respectively.

A source lightwave, illustrated by the arrow labeled WS, is coupled to the fiber 126 for propagation through port A of the coupler 120. The coupler 120 preferably has a coupling efficiency of 50 percent so that one-half of the optical power of the wave WS is coupled into the fiber 128, while the other, uncoupled half propagates through the fiber portion 126. Thus, the coupler 120 splits the source light WS into two waves W1, W2 which propagate through the magnetic sensor 98 in opposite directions. It is important that the waves W1, W2 have a high degree of circular polarization, since the efficiency of operation of the magnetic sensor 98 depends upon the degree to which circularly polarized light is utilized. For purposes of this discussion, it will be assumed that the waves W1, W2 are right-hand circularly polarized when they leave the coupler 120.

The B field of the ambient magnetic field to be sensed is illustrated in FIG. 21 by a vector 130. For maximum effect upon the wave W1, W2 as they propagate through the magnetic sensor 98, the orientation of the sensor 98 should be such that the straight portions 124 are parallel to the magnetic field 130. In describing the effect of the magnetic sensor 98 upon the waves W1, W2, it will be assumed that a right-hand circularly polarized wave is retarded in phase when its propagation direction is opposite of that of the magnetic field vector 130, and advanced in phase when its propagation direction is the same as that of the field 130. Further, it will be assumed that left-hand circularly polarized light is retarded in phase when its direction of propagation is the same as that of the magnetic field 130, and that its phase is advanced when its propagation direction is opposite that of the magnetic field 130.

Considering first the wave W1, as this right-hand circularly polarized wave W1 propagates from the fiber portion 126 through the stright portion 124A of the sensor 98, its direction of propagation will be opposite that of the magnetic field 130, and thus, the phase of this wave W1 will be retarded, e.g., by an amount $\theta$. The amount of phase shift, and thus the value of $\theta$, depends on the strength of the field 130. When the wave W1 traverses the curved portion 125A, the linear birefringence of this curved portion will transform the polarization of the wave W1 so that it is left-hand circularly polarized as it enters the straight portion 124B. Since, in the straight portion 124B, the direction of propagation of this left-hand circularly polarized wave W1 is in the same direction as the magnetic field 130, the phase of the wave W1 will again be retarded by an amount $\theta$, so that the wave W1 has now been retarded in phase by $2\theta$. The wave W1 then traverses the curved portion 125B where its polarization is again transformed to right-hand circular, and its propagation direction reversed, as it enters the straight portion 124C. Thus, propagation of the wave W1 through the straight portion 124C will yield another phase delay equal to $\theta$, yielding an accumulated phase lag of 30. Similarly, the curved portion 125C reverses the propagation direction and transforms the polarization of the wave W1 to right-hand circular, and thus, the phase of the wave W1 will be retarded by yet another increment $\theta$ in the straight 124D, yielding an accumulated phase delay for the wave W1 of 40. Finally, the wave $W_1$ similarly undergoes a transformation in the curved portion 125D and a phase delay in the portion 124E for a total phase delay of 50.

The right-hand circularly polarized wave W2 propagates through the magnetic sensor 98 in a manner similar to that just described for the wave W1. Further, since there are an even number of curved portions 125, the polarization of the wave W2 will be the same as the wave W1 in any given one of the straight portions 124. That is, it will be right-hand circularly polarized in the straight portions 124E, 124C, and 124A, and it will be left-hand circularly polarized in the straight portions 124D and 124B. However, since the wave W2 propagates in the opposite direction from the wave W1, its orientation relative to the magnetic field 130 will be opposite that of the wave W1 in any given straight portion 124. Therefore, the phase of the wave W2, instead of being retarded, will be advanced by an amount $\theta$ as it traverses each straight portion 124, and thus the accumulated phase lead for all five straight portions 124 will be 5 $\theta$. Since the wave W2 is advanced in phase by 5 $\theta$, while the wave W1 is retarded in phase by a like amount, the total phase difference between the waves W1, W2, for this output will be equal to 10 $\theta$.

After the waves W1, W2 have counter-propagated through the magnetic sensor 98, they will be recombined at the coupler 120 to form an optical output signal, designated by the arrow labeled W0. The intensity of this optical output signal W0 is dependent upon the type (e.g., constructive or destructive) and amount of interference of the waves W1, W2, when they are recombined at the coupler 120, which, in turn, is dependent upon the phase difference between the waves W1, W2. Since this phase difference is a function of the strength of the magnetic field 130, the intensity of the optical output signal W0 will likewise be a function of the magnetic field strength. Thus, by detecting the optical intensity of this signal W0, the strength of the magnetic field 130 may be determined. It will be understood that the magnetometer may also be utilized as a current sensor by positioning the sensor 98 in the magnetic field of an electrical conductor, preferably with the straight portions 124 parallel to the B-field produced by current through the conductor.

Figure 22:
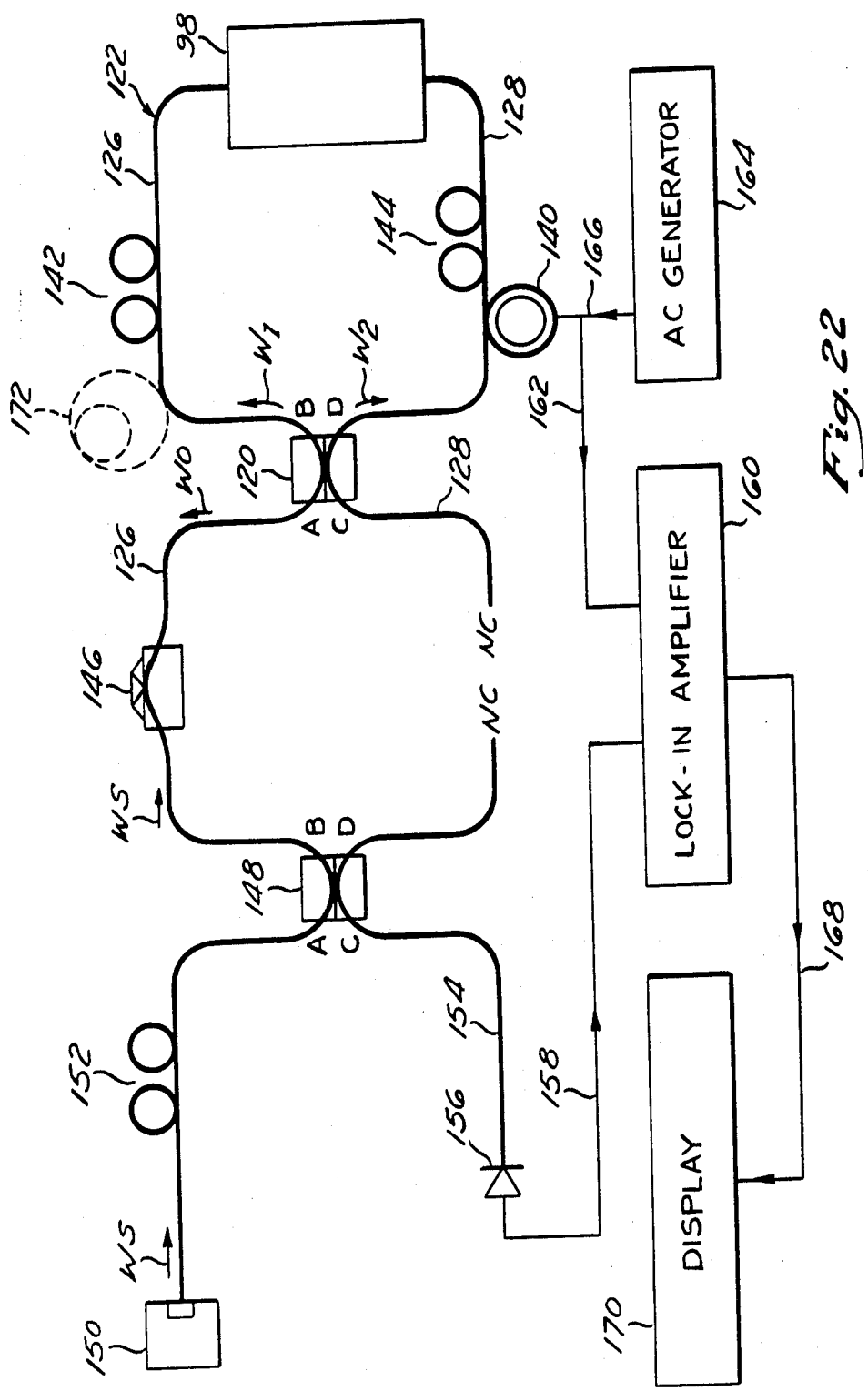
FIG. 22 is a schematic drawing of the magnetometer of FIG. 21, showing one presently preferred detection system for synchronously detecting the intensity of the optical output signal.

An all fiber optic system, for detecting the intensity of the optical output signal W0, is shown in FIG. 22 as comprising the magnetic sensor 98, coupler 120, and fiber 122 of FIG. 21. In addition, a PZT phase modulator 140 is included in the fiber portion 128, between port D of the coupler 120 and the magnetic sensor 98. Each of the fiber portions 126, 128 have respective polarization controllers 142, 144, positioned between the coupler 120 and the sensor 98, for adjusting the polarization of the counter-propagating waves W1, W2. The portion of the fiber 128 projecting from the port C of the coupler 120 terminates non-reflectively at the point labeled "NC", while the portion of the fiber 126 projecting from the port A of the coupler 120 passes through a polarizer 146, and then through ports labeled A and B of a coupler 148. The fiber portion 126, projecting from the port A, terminates at a light source 150, which supplies the source lightwave WS into the fiber portion 126. By way of specific example, this light source 150 may comprise a laser diode producing light having a wavelength of 0.82 microns, such as the model GO-DIP gallium arsenide laser diode, commercially available from General Optronics Corp., 3005 Hadley Road, South Plainfield, N.J. A polarization controller 152 may be included between the light source 150 and polarizer 146 to adjust the polarization of the source light WS so that it passes efficiently through the polarizer 146. A second fiber 154 passes through the ports C and D of the coupler 148. The portion of this fiber 154 projecting from the port C is optically coupled to a photodetector 156, while the portion projecting from the port D terminates non-reflectively at the point labeled "NC". By way of specific example, the photodetector 156 may comprise a standard, reversed bias, silicon, PIN-type, photodiode. The output from the detector 156 is supplied on a line 158 to a lock-in amplifier 160, which also receives a reference signal, on a line 162, from a signal generator 164. The signal generator 164 is connected by a line 166 to drive the PZT phase modulator 140 at the reference signal frequency. The lock-in amplifier 160 utilizes the reference signal for enabling the amplifier 160 to synchronously detect the detector output signal at the modulation frequency. Thus, the amplifier 160 effectively provides a bandpass filter at the fundamental frequency (i.e., first harmonic) of the modulator 140, blocking all other harmonics of this frequency. The amplifier 160 outputs a signal on a line 168, which is proportional to this first harmonic, for visual display on a display panel 170.

During operation of the magnetometer of FIG. 22, source light Ws, from the light source 150, is introduced into the fiber portion 126. The wave WS propagates through the coupler 148, where a portion of the light is lost through port D. The remaining light WS propagates through the polarizer 146, which passes e.g., linear vertical polarizations. In this regard, the polarization controller 152 is adjusted for efficient passage of light through the polarizer 146. Thus, light entering the coupler 120 will have a linear vertical polarization. The coupler 120 splits the light into two counter-propagating waves W1, W2. The wave W1 initially propagates through the portion 126 of the fiber 122, while the wave W2 initially propagates through the portion 128 of the fiber 122. The polarization controller 142 is adjusted to transform the state of polarization of the wave W1 so that, when it enters the magnetic sensor 98, it will be circularly polarized, e.g., right-hand circularly polarized. Similarly, the polarization controller 144 is adjusted so that the wave W2 has the same polarization, e.g., right-hand circular, when it enters the sensor 98. It will be understood that the PZT modulator 140 may introduce additional linear birefringence into the fiber portion 128 and thus the controller 144 should be adjusted to compensate for any such linear birefringence of the modulator 140 so that, when the waves W1, W2 enter the sensor 98, the wave W2 has the same circular polarization as the wave W1. As the waves W1, W2 counter-propagate through the sensor 98, one wave will be advanced in phase whie the other is retarded, due to the influence of ambient magnetic fields, as discussed in reference to FIG. 21. Further, it will be recalled from FIG. 21 that, since the sensor 98 comprises an even number of curved portions 125 (FIG. 21), the polarization of a given wave exiting the sensor 98 will be the same as that when it entered the sensor 98. Thus, both waves W1, W2 will be right-hand circularly polarized after they have traversed the sensor 98. As the waves W1, W2 propagate from the sensor 98 to the coupler 120, they will pass through the controllers 144, 142, respectively. Since these controllers are reciprocal devices (i.e., they affect the waves in the same manner, regardless of the direction of propagation), the waves W1, W2 will be transformed in polarization, from right-hand circular to vertical linear, when they reach the coupler 120. The waves W1, W2 are then recombined at the coupler 120 to form an optical signal, a porton of which is lost through the port C, while the remaining portion propagates through the polarizer 146. Since the optical output signal has a linear vertical polarization, it will pass through the polarizer 146 to the coupler 148, where a portion of the signal W0 is coupled to the fiber 154 for propagation to the photodetector 156.

The detector 156 outputs a signal proportional to the intensity of the optical output signal W0, and sends this signal on the line 158 to the lock-in amplifier 160. As previously indicated, the amplifier 160 synchronously detects the detector output signal at the modulation frequency of the modulator 140, so that this amplifier 160 effectively provides a bandpass filter at the fundamental frequency of the modulator 140, blocking all other harmonics of this frequency. The first harmonic of the detector output signal is a sinusoidal function having a magnitude proportional to the phase difference between the waves W1, W2, and therefore, is also a function of the strength of the magnetic field inducing such phase difference. The amplifier 140 outputs a signal, which is proportional to this first harmonic component, and thus provides a direct indication of the strength of the magnetic field, which may be visually displayed on the display panel 170. Further details of this detection system for synchronously detecting the optical output signal are provided in copending patent application, Ser. No. 319,311, filed on the same date as this application, entitled "FIBER OPTIC ROTATION SENSOR", which is a continuation in part of patent application, Ser. No. 307,095, filed Sept. 30, 1981, which in turn is a continuation in part of U.S. Pat. No. 4,410,275, issued Oct. 18, 1983 on application, Ser. No. 249,714, filed Mar. 30, 1981, and is assigned to the assignee of the present invention.

As described in this patent application, which is hereby incorporated by reference herein, it is preferable to operate the PZT modulator 140 at the frequency ($f_m$) defined by the following equation, since use of this modulation frequency eliminates modulator induced amplitude modulation in the optical signal measured by the detector 156:

$$f_m = \frac{c}{2N_{eq}L} \quad (6)$$

where L is the differential fiber length between the coupler 120 and modulator 140, for the counter-propagating waves W1, W2; $N_{eq}$ is the equivalent refractive index for the single mode fiber 122, and c is the free-space velocity of the light applied to the fiber 122. Assuming that the differential fiber length L is, for example, about 6 meters, the modulation frequency ($f_m$) will be about 17.5 megahertz for a silica fiber having an equivalent refractive index equal to 1.45. Those skilled in the art will recognize that presently available fiber phase modulators do not respond well at these high frequencies. Furthermore, detection of the optical signal at high frequencies is more difficult. Thus, it is desirable to adapt the system of FIG. 22 for operation at lower frequencies, within the operating range of the photodetector 156. This may be accomplished by increasing the differential fiber length (L), for example, by forming a delay line 172, as shown in phantom in FIG. 22. The delay line 172 may be formed from the fiber portion 126, between the coupler 120 and sensor 98, or it may be formed from the fiber portion 128, between the modulator 140 and sensor 98. Assuming, for example, that the delay line 172 increases the differential fiber length L to about 100 meters, the modulator frequency $f_m$, defined by Equation 6, will be about 1 megahertz, which is within the operating range of the phase modulator 140. The delay line 172 may be wrapped in a loop, so that it is relatively compact, e.g., in the manner of a sagnac interferometer loop. However, as described in the above-referenced patent application entitled Fiber Optic Rotation Sensor, ambient magnetic fields can induce non-reciprocal behavior for light waves counter-propagating through interferometer loops. Since the delay line 172 is somewhat similar to an interferometer loop, it may be preferable to enclose the line 172 in a housing (not shown) comprised, e.g. of $\mu$-metal, to isolate the delay line 172 from magnetic fields.

It will be recalled from the discussion in reference to FIG. 1 that, because the magnetic sensor 98 has an even number of curved portions 125, the polarization of the waves W1, W2 is unchanged as these waves traverse the sensor 98, i.e., if they are right-hand circularly polarized when they enter the sensor 98, they will be right-hand circularly polarized when they leave the sensor. However, if an odd number of curved portions 125 are provided, the polarization of the waves W1, W2 will be changed to an orthogonal state as they traverse the sensor 98, i.e, if they enter the sensor 98 right-hand circularly polarized, they will leave the sensor 98 left-hand circularly polarized. Thus, for a sensor having an odd number of curved portions 125, the polarization controllers 142, 144 of FIG. 22 must be adjusted in a manner different from that described above. Specifically, the controllers 142, 144 should be adjusted so that the counter-propagating waves W1, W2 have mutually orthogonal circular polarizations when they enter the sensor 98. That is, one of the waves W1, W2 should be right-hand circularly polarized, while the other should be left-hand circularly polarized.

Assuming now that the sensor 98 of FIG. 22 has an odd number of curved portions 125 (FIG. 21), the controller 142 will be adjusted so that the wave W1, which is linearly polarized upon leaving the coupler 120, is transformed to e.g., right-hand circularly polarized, upon entering the sensor 98. Similarly, the controller 144 is adjusted so that the wave W2, which is also vertical linearly polarized upon leaving the coupler 120, is transformed to e.g., a left-hand circularly polarized wave upon entering the sensor 98. After the polarizations will have been changed to orthogonal states, e.g., right-hand circularly polarized for the wave W2, and left-hand circularly polarized for the wave W1. Since the controllers 142, 144 are reciprocal devices (i.e., they affect a wave in the same manner, regardless of the direction of propagation), the controller 142 will transform tthe right-hand circularly polarized wave W2 to vertical linearly polarized, and the controller 144 will transform the left-hand circularly polarized wave W1 to vertical linearly polarized. Thus, the waves W1, W2 will be recombined by the coupler 120 with the same polarization as when they entered the coupler 120, so that the optical output signal W0 formed by these waves W1, W2 will pass efficiently through the polarizer 146.

Figure 23:
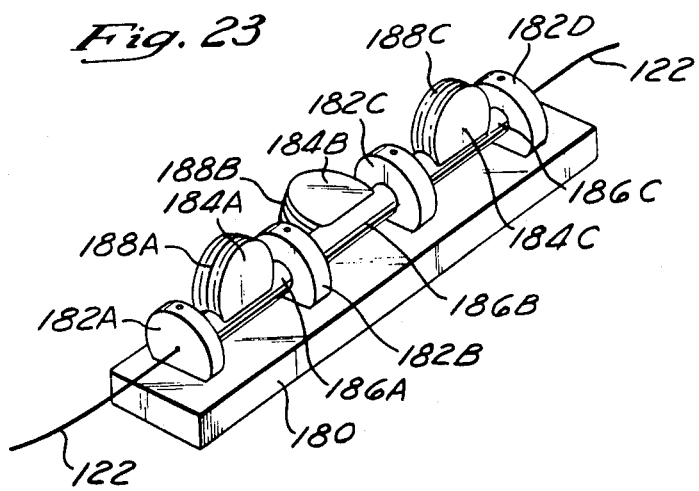
FIG. 23 is a perspective view of a polarization controller suitable for use in the magnetometer of FIG. 22.

A preferred type of polarization controller suitable for use in the magnetometer of FIG. 22 is described in U.S. Pat. No. 4,389,090, issued June 21, 1983 on application, Ser. No. 183,975, filed Sept. 4, 1980, entitled "FIBER OPTIC POLARIZATION CONTROLLER", assigned to the assignee of the present invention, and hereby incorporated by reference herein. As shown in FIG. 23, the controller includes a base 180 in which a plurality of upright blocks 182A through 182D are mounted. Between adjacent ones of the blocks 182, spools 184A through 184C are tangentially mounted on shafts 186A through 186C, respectively. The shafts 186 are axially aligned with each other, and are rotatably mounted between the blocks 182. The spools 184 are generally cylindrical and are positioned tangentially to the shafts 186, with the axes of the spools 184 perpendicular to the axes of the shafts 186. The fiber strand 122 extends through axial bores in the shafts 186 and is wrapped about each of the spools 184 to form three coils 188A through 188C. The radii of the coils 188 are such that the fiber 122 is stressed to form a birefringent medium in each of the coils 188. The three coils 188A through 188C may be rotated independently of each other about the axes of the shafts 186A through 186C, respectively, to adjust the birefringence of the fiber 122 and, thus, control the polarization of the light passing through the fiber 122. The diameter and number of turns in the coil 188 are such that the outer coils 188A and C provide a spatial delay of one-quarter wavelength, whie the central coil 188B provides a spatial delay of one-half wavelength. The quarter wavelength coils 188A and C control the ellipticity of the polarization, and the half wavelength coil 188B controls the direction of polarization. This provides a full range of adjustment of the light propagating through the fiber 122. It will be understood, however, that the polarization controller may be modified to provide only the two quarter wave coils 188A and C, since the direction of polarization (otherwise provided by the central coil 188B) may be controlled indirectly through proper adjustment of the ellipticity of polarization by means of the two quarter wave coils 188A and C. Accordingly, the polarization controllers 142, 144, 152 are shown in FIG. 22 as including only the two quarter wave coils 188A and C. Since this configuration reduces the overall size of the controllers 142, 144, 152, it may be advantageous for certain applications of the present invention involving space limitations.

Thus, the polarization controllers 142, 144 and 152 provide means for establishing, maintaining, and controlling the polarization of both the applied light and the counter-propagating waves.

Figure 24:
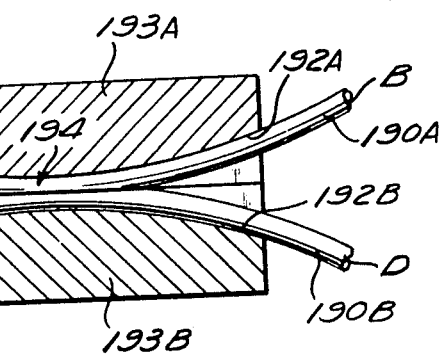
FIG. 24 is an elevation view, in partial cross-section, of a fiber optic directional coupler, suitable for use in the magnetometer of FIGS. 21 and 22.

A preferred fiber optic directional coupler for use as the couplers 120, 148 in the magnetometer of the present invention is described in copending patent application, Ser. No. 300,955, filed Sept. 10, 1981, now issued as U.S. Pat. No. 4,536,058, entitled "FIBER OPTIC DIRECTIONAL COUPLER", which is a continuation-in-part of patent application, Ser. No. 139,511, filed Apr. 11, 1980, now issued as U.S. Pat. No. 4,493,528, entitled "FIBER OPTIC DIRECTIONAL COUPLER", both of said patent applications being assigned to the assignee of the present invention. These copending patent applications are hereby incorporated by reference herein. As shown in FIG. 24, the coupler comprises two optical fiber strands, labeled 190A, 190B, of a single mode fiber optic material having a portion of the cladding removed from one side thereof. The two strands 190A, 190B are mounted in respective arcuate slots 192A, 192B, formed in respective blocks 193A, 193B. The strands 190A, 190B are positioned with the portions of the strands where the cladding has been removed juxtaposed, to form a region of interaction 194, in which the light is transferred between the core portions of the strands. The amount of material removed is such that the core portion of each strand 190 is within the evanescent field of the other. The center spacing between the cores of the strands 190 of the center at the coupler is typically less than about 2 to 3 core diameters.

It is important to note that the light transferred between the strands 190 at the region of interaction 194 is directional. That is, substantially all of the light applied to input port A is delivered to the output ports B and D, without contra-directional coupling, to port C. Likewise, substantially all of the light applied to input port C is delivered to the output ports B and D. Further, this directivity is symmetrical. Thus, light supplied to either input port B or input port D is delivered to the output ports A and C. Moreover, the coupler is essentially non-discriminatory with respect to polarizations, and thus preserves the polarization of the coupled light. Thus, for example, if a light having a vertical polarization is input to port A, the light coupled from port A to port D, as well as the light passing straight through from port A to port B, will remain vertically polarized.

From the foregoing, it can be seen that the coupler may function as a beam splitter to divide the applied light into two counter-propagating waves W1, W2. Further, the coupler may additionally function to recombine the counter-propagating waves W1, W2 after they have traversed the magnetometer 98.

In the embodiment shown in FIG. 22, each of the couplers 120, 148 has a coupling efficiency of 50 percent, as this choice of coupling efficiency provides maximum optical power at the photodetector 156. As used herein, the term "coupling efficiency" is defined as the power ratio of the coupled power to the total output power, expressed as a percent. For example, referring to FIG. 24, if light is applied to port A, the coupling efficiency would be equal to the ratio of the power at port D to the sum of the power output at ports B and D. Further, a coupling efficiency of 50 percent for the coupler 120 ensures that the counter-propagating waves W1, W2 are equal in magnitude.

What is claimed is:

1. A magneto-optic rotator, comprising:
   a series of portions of optical fiber, said fiber portions oriented to cause Faraday rotation of a lightwave propagating therethrough upon exposure to a magnetic field; and
   means for optically interconnecting said fiber portions to provide a continuous optical path for propagation of said lightwave serially through each of said fiber portions, said interconnecting means reversing the direction of propagation of said lightwave from the perspective of a fixed observer as it serially propagates from one of said series of fiber portions to the next adjacent one of said series of fiber portions such that the propagation direction of said lightwave reverses relative to the direction of said magnetic field to cause said Faraday rotation to be in one direction for said one of said series of fiber portions and in the opposite direction for said next adjacent one of said series of fiber portions from the perspective of said lightwave, said interconnecting means including means for transforming the polarization of said lightwave including an amount sufficient to cause the Faraday rotations in said fiber portions to be additive from the perspective of a fixed observer.

2. A magneto-optic rotator, as defined by claim 1, wherein said interconnecting means comprises a curved portion of optical fiber, integral with said fiber portions.

* * * * *